United States Patent
Koliopoulos et al.

(10) Patent No.: US 7,324,917 B2
(45) Date of Patent: Jan. 29, 2008

(54) METHOD, SYSTEM, AND SOFTWARE FOR EVALUATING CHARACTERISTICS OF A SURFACE WITH REFERENCE TO ITS EDGE

(75) Inventors: Chris L. Koliopoulos, Tucson, AZ (US); Jaydeep K. Sinha, Mansfield, MA (US); Delvin A. Lindley, Tucson, AZ (US); John F. Valley, Tucson, AZ (US); Noel Poduje, Needham Heights, MA (US)

(73) Assignee: KLA-Tencor Technologies Corporation, Milpitas, CA (US)

( * ) Notice: Subject to any disclaimer, the term of this patent is extended or adjusted under 35 U.S.C. 154(b) by 222 days.

(21) Appl. No.: 11/173,438

(22) Filed: Jul. 1, 2005

(65) Prior Publication Data

US 2006/0004542 A1    Jan. 5, 2006

Related U.S. Application Data

(60) Provisional application No. 60/585,390, filed on Jul. 2, 2004.

(51) Int. Cl.
*G06F 15/00* (2006.01)

(52) U.S. Cl. ........................... 702/155; 702/127

(58) Field of Classification Search ............... 702/155, 702/156, 167, 127, 166; 250/559.2; 356/3.08
See application file for complete search history.

(56) References Cited

U.S. PATENT DOCUMENTS

| | | | |
|---|---|---|---|
| 4,168,437 A | 9/1979 | Nihomatsu | |
| 5,125,746 A * | 6/1992 | Lipshitz | 356/606 |
| 5,471,307 A | 11/1995 | Koliopoulos | |
| 5,982,491 A * | 11/1999 | Breyer et al. | 356/614 |
| 6,026,583 A | 2/2000 | Yoshizumi | |
| 6,828,163 B2 * | 12/2004 | Kobayashi et al. | 438/14 |
| 2003/0023402 A1 | 1/2003 | Kobayashi | |
| 2003/0045089 A1 | 3/2003 | Wenski | |
| 2004/0185662 A1 | 9/2004 | Fujisawa | |
| 2006/0153447 A1 * | 7/2006 | Ouchi | 382/173 |

* cited by examiner

*Primary Examiner*—John Barlow
*Assistant Examiner*—Douglas N Washburn
(74) *Attorney, Agent, or Firm*—Caven & Aghevli LLC

(57) ABSTRACT

A method and software is disclosed for evaluating characteristics, such as flatness, of a surface of a sample having an edge, comprising selecting an evaluation area having an area surface and a boundary, at least one portion of which is definable with reference to the edge, and evaluating characteristics of the area surface. Edge-specific evaluation conditions are used with edge-specific metrics to quantify parameters for said evaluation area. A system for evaluating such characteristics comprises a data collection system for generating data values for selected locations on said surface; and a data analyzing system for analyzing data values to determine such characteristics. A data interpolation system may be provided to interpolate data values collected with reference to a first coordinate system for analyzing with reference to a second coordinate system.

54 Claims, 26 Drawing Sheets

Fig. 12

STEP 600B: ACQUIRE DATA BY INTERPOLATION.

STEP 650: COORDINATE DEFINITION

STEP 652: DEFINE INPUT DATA CART. GRID 651 TO FORM LOCATIONS 680 IN CART. COORDINATES

STEP 653: DEFINE LOCATIONS 680 IN POLAR COORDINATES

STEP 654: DEFINE UNIFORM POLAR GRID TO FORM LOCATIONS 620 IN POLAR COORDINATES

STEP 670: ZONE AND ANNULAR SECTOR DEFINITION

STEP 672: CREATE ZONES 44, 64 BASED ON RADII 22, 42, 43

STEP 673: CREATE ANNULAR SECTORS 240A, 260A BASED ON ZONES 44, 64 SELECTED ANGLE A.

STEP 685: OBTAIN VALUES 660 FOR LOCATIONS 680.

STEP 690: EXCLUSION AND INTERPOLATION

STEP 692: EXCLUDE SELECTED DATA

STEP 694: DEVELOP INTERPOLATED DATA VALUES 645 BY INTERPOLATING DATA VALUES 660 ONTO LOCATIONS 625.

TO STEP 700 (FIG. 10)

Fig. 15a

| EG CONDITIONS 110 (USING EG EVAL AREA 7) | DEVIATION SURFACE 86 | EDGE-SPECIFIC METRICS 50 | EDGE-SPECIFIC STATISTICS 950 |
|---|---|---|---|
| EGBI CONDITIONS 410 (USING BI PLANAR FITTED SURFACE 184BI) | BI PLANAR DEVIATION SURFACE 186BIC | EGBIR METRIC 411 | MEAN EGBIR STATISTIC 511 |

Fig. 15b

| EG CONDITIONS 110, CONTD. | DEVIATION SURFACE 86 | EDGE-SPECIFIC METRICS 50 | EDGE-SPECIFIC STATISTICS 950 |
|---|---|---|---|
| EGF3 CONDITIONS 420<br><br>USING F3 PLANAR FITTED SURFACE 184F3 | F3 PLANAR COINCIDENT DEVIATION SURFACE 186F3C | • EGF3R METRIC 421<br>• EGF3D' METRIC 426<br>• EGF3X' METRIC 427<br>• EGF3N' METRIC 428<br>• EGF3Q' METRIC 429 | • MEAN EGF3R STATISTIC 521<br>• MEAN EGF3D' STATISTIC 526<br>• MEAN EGF3X' STATISTIC 527<br>• MEAN EGF3N' STATISTIC 528<br>• MEAN EGF3Q' STATISTIC 529 |

Fig. 15c

| EG CONDITIONS 110, CONTD. | DEVIATION SURFACE 86 | EDGE-SPECIFIC METRICS 50 | EDGE-SPECIFIC STATISTICS 950 |
|---|---|---|---|
| EGFL CONDITIONS 440<br><br>USING FL PLANAR FITTED SURFACE 184FL | FL PLANAR COINCIDENT DEVIATION SURFACE 186FLC | • EGFLR METRIC 441<br>• EGFLD' METRIC 446<br>• EGFLX' METRIC 447<br>• EGFLN' METRIC 448<br>• EGFLQ' METRIC 349 | • MEAN EGFLR STATISTIC 541<br>• MEAN EGFLD' STATISTIC 546<br>• MEAN EGFLX' STATISTIC 547<br>• MEAN EGFLN' STATISTIC 548<br>• MEAN EGFLQ' STATISTIC 549 |

Fig. 15d

| ES CONDITIONS 130 (USING ES EVALU-ATION AREA 9) | DEVIATION SURFACE 86 | EDGE-SPECIFIC METRICS 50 | EDGE-SPECIFIC STATISTICS 950 |
|---|---|---|---|
| ESBI CONDITIONS 310 (USING BI PLANAR FITTED SURFACE 184BI) | BI PLANAR DEVIATION SURFACES 186BIC, 186BID • COLLECTIVELY BI PLANAR DEVIATION SURFACES 186BI | ESBIR METRIC 311 | MEAN ESBIR STATISTIC 911 |
| | BI PLANAR DISPLACED DEVIATION SURFACE 186BID | • ESBID METRIC 312<br>• ESBIX METRIC 313<br>• ESBIN METRIC 314<br>• ESBIQ METRIC 315 | • MEAN ESBID STATISTIC 912<br>• MEAN ESBIX STATISTIC 913<br>• MEAN ESBIN STATISTIC 914<br>• MEAN ESBIQ STATISTIC 915 |
| | BI PLANAR COINCIDENT DEVIATION SURFACE 186BIC | • ESBID' METRIC 316<br>• ESBIX' METRIC 317<br>• ESBIN' METRIC 318<br>• ESBIQ' METRIC 319 | • MEAN ESBID' STATISTIC 916<br>• MEAN ESBIX' STATISTIC 917<br>• MEAN ESBIN' STATISTIC 918<br>• MEAN ESBIQ' STATISTIC 919 |

Fig. 15e

| ES CONDITIONS 130, CONTD. | DEVIATION SURFACE 86 | EDGE-SPECIFIC METRICS 50 | EDGE-SPECIFIC STATISTICS 950 |
|---|---|---|---|
| ESF3 CONDITIONS 320 | F3 PLANAR DEVIATION SURFACES 186F3C, 186F3D (F3 PLANAR DEV SURFACES 186F3) | ESF3R METRIC 321 | MEAN ESF3R STATISTIC 921 |
| USING F3 PLANAR FITTED SURFACE 184F3 | F3 PLANAR DISPLACED DEVIATION SURFACE 186F3D | • ESF3D METRIC 322<br>• ESF3X METRIC 323<br>• ESF3N METRIC 324<br>• ESF3Q METRIC 325 | • MEAN ESF3D STATISTIC 922<br>• MEAN ESF3X STATISTIC 923<br>• MEAN ESF3N STATISTIC 924<br>• MEAN ESF3Q STATISTIC 925 |
| | F3 PLANAR COINCIDENT DEVIATION SURFACE 186F3C | • ESF3D' METRIC 326<br>• ESF3X' METRIC 327<br>• ESF3N' METRIC 328<br>• ESF3Q' METRIC 329 | • MEAN ESF3D' STATISTIC 926<br>• MEAN ESF3X' STATISTIC 927<br>• MEAN ESF3N' STATISTIC 928<br>• MEAN ESF3Q' STATISTIC 929 |

Fig. 15f

| ES CONDITIONS 130, CONTD. | DEVIATION SURFACE 86 | EDGE-SPECIFIC METRICS 50 | EDGE-SPECIFIC STATISTICS 950 |
|---|---|---|---|
| ESFL CONDITIONS 340 | FL PLANAR DEVIATION SURFACES 186FLD, 186FLC (FL PLANAR DEV SURFACES 186FL) | ESFLR METRIC 341 | MEAN ESFLR STATISTIC 941 |
| USING FL PLANAR FITTED SURFACE 184FL | FL PLANAR DISPLACED DEVIATION SURFACE 186FLD | • ESFLD METRIC 342<br>• ESFLX METRIC 343<br>• ESFLN METRIC 344<br>• ESFLQ METRIC 345 | • MEAN ESFLD STATISTIC 942<br>• MEAN ESFLX STATISTIC 943<br>• MEAN ESFLN STATISTIC 944<br>• MEAN ESFLQ STATISTIC 945 |
| | FL PLANAR COINCIDENT DEVIATION SURFACE 186FLC | • ESFLD' METRIC 346<br>• ESFLX' METRIC 347<br>• ESFLN' METRIC 348<br>• ESFLQ' METRIC 349 | • MEAN ESFLD' STATISTIC 946<br>• MEAN ESFLX' STATISTIC 947<br>• MEAN ESFLN' STATISTIC 948<br>• MEAN ESFLQ' STATISTIC 949 |

Fig. 15g

| ES CONDITIONS 130, CONTD. | DEVIATION SURFACE 86 | EDGE-SPECIFIC METRICS 50 | EDGE-SPECIFIC STATISTICS 950 |
|---|---|---|---|
| ESFQ CONDITIONS 360 USING FITTED REFERENCE SURFACE 84FQ • FQ PLANAR FITTED SURFACE 184FL • FQ CONICAL FITTED SURFACE 284FL' | FQ PLANAR DEVIATION SURFACES 186FQC, 186FQD (FQ PLANAR DEVIATION SURFACE 186FQ) | ESFQR METRIC 584 | MEAN ESFQR STATISTIC 585 |
| | FQ PLANAR DISPLACED DEVIATION SURFACE 186FQD | ESFQD METRIC 586<br>ESFQX METRIC 588<br>ESFQN METRIC 592<br>ESFQQ METRIC 594 | MEAN ESFQD STATISTIC 587<br>MEAN ESFQX STATISTIC 589<br>MEAN ESFQN STATISTIC 593<br>MEAN ESFQQ STATISTIC 595 |
| | FQ PLANAR COINCIDENT DEVIATION SURFACE 186FQC | ESFQD' METRIC 596<br>ESFQX' METRIC 598<br>ESFQN' METRIC 602<br>ESFQQ' METRIC 604 | MEAN ESFQD' STATISTIC 597<br>MEAN ESFQX' STATISTIC 599<br>MEAN ESFQN' STATISTIC 603<br>MEAN ESFQQ' STATISTIC 605 |
| | FQ CONICAL DEV. SUR. 286FQ'C, 286FQ'D (FQ CON DEV. SUR 286FQ') | ESFQ'R METRIC 606 | MEAN ESFQ'R STATISTIC 607 |
| | FQ CONICAL DISPLACED DEVIATION SURFACE 286FQ'D | ESFQ'D METRIC 608<br>ESFQ'X METRIC 612<br>ESFQ'N METRIC 614<br>ESFQ'Q METRIC 616 | MEAN ESFQ'D STATISTIC 609<br>MEAN ESFQ'X STATISTIC 613<br>MEAN ESFQ'N STATISTIC 615<br>MEAN ESFQ'Q STATISTIC 617 |
| | FQ CONICAL COINCIDENT DEVIATION SURFACE 286FQ'C | ESFQ'D' METRIC 618<br>ESFQ'X' METRIC 622<br>ESFQ'N' METRIC 624<br>ESFQ'Q' METRIC 626 | MEAN ESFQ'D' STATISTIC 619<br>MEAN ESFQ'X' STATISTIC 623<br>MEAN ESFQ'N' STATISTIC 628<br>MEAN ESFQ'Q' STATISTIC 627 |

Fig. 23

STEP 714: USE EVALUATION ALGORITHM 384 TO DEFINE FITTED REFERENCE SURFACE 84

STEP 715: SELECT WAFER SURFACE RELATIVE FROM WHICH THE FITTED REFERENCE SURFACE 84 IS DERIVED
- SELECT "F", THE FRONT SURFACE 6, OR
- SELECT "B", THE BACK SURFACE 8.

STEP 713: USE STEP 713A TO SELECT PLANAR FITTED SURFACE 184 OR USE STEP 713B TO SELECT CONICAL FITTED SURFACE 284

STEP 713A: DEFINE PLANAR FITTED SURFACE 184A BY DEFINING $Z = aX + bY + c$.

STEP 713B: DEFINE CONICAL FITTED SURFACE 284 BY DEFINING A PORTION OF CONE SURFACE 183, NOT INCLUDING THE BASE, BY $Z = aR + b\theta + c$, WITH

- R AS DISTANCE OF SURFACE FROM $Z(R,\theta)$ TO AN ORIGIN,
- $\theta$ AS ANGLE FORMED BETWEEN LINE FORMING $\theta = 0$ AND LINE CONNECTING $Z(R,\theta)$ TO THE ORIGIN.

FIG. 25

STEP 713B: DEFINE CONICAL FITTED SURFACE 284 USING METHOD 384FQ':

CONICAL FRONT SURFACE (LEAST SQUARES SECTOR) METHOD 484FQ':

- DEFINE BY MINIMIZING DIFFERENCE OF SQUARES BETWEEN SURFACE 284FQ' AND AREA WITHIN ANNULUS 44.

- IF ANNULAR SECTOR 40B CONTAINS
  $\theta = 2\pi$,
  DEFINE $\theta$ AS ANGLE BETWEEN
    - LINE PASSING THROUGH THE CENTER OF THE ANNULAR SECTOR 40B AND
    - LINE PASSING THROUGH THE POINT OF LEAST SQUARES EVALUATION.

→ CONICAL FRONT SURFACE LEAST SQUARES (SECTOR) CONICAL FITTED SURFACE 284FQ'

METHOD, SYSTEM, AND SOFTWARE FOR EVALUATING CHARACTERISTICS OF A SURFACE WITH REFERENCE TO ITS EDGE

CROSS-REFERENCE TO RELATED APPLICATION

The present application claims the benefit of the filing date of U.S. Provisional Patent Application No. 60/585,390, filed Jul. 2, 2004, the entire disclosure of which is incorporated herein by reference.

The present invention is directed to the field of materials processing, and more particularly to a novel method and system for evaluating characteristics of a semiconductor wafer.

BACKGROUND

The production and quality control processes used by semiconductor device manufacturers and material producers, among others, often require an accurate knowledge of wafer characteristics such as flatness, diameter, thickness, bow, warp, and resistivity, among others.

Automated, high-throughput assembly line systems may be employed to obtain the desired information on wafer characteristics. For example, in order to evaluate the flatness of a wafer, typically, the wafers are moved into a wafer flatness station. The flatness station is operated to provide information representative of the degree of flatness or deviation from a planar or other intended surface, for each wafer. Such information may be advantageously utilized, for example, during the various phases of photolithographic processing typically employed in electronic circuit device fabrication.

Conventionally, semiconductor wafer flatness is determined by evaluating the deviation of a wafer surface relative to a defined surface, called herein the deviation surface. The flatness parameters involved in the conventional evaluation of semiconductor wafers include global or local evaluation of the wafer, definition of the surface from which deviation from the wafer will be evaluated, and presentation format of the metrics calculation. Some options for the parameters, described below, are outlined in SEMI STD M1-1103, SPECIFICATIONS FOR POLISHED MONOCRYSTALLINE SILICON (©SEMI 1978, 2003) (hereinafter SEMI STD M1-1103).

SEMI STD M1-1103 contains dimensional and crystallographic orientation characteristics and limits on surface defects for semiconductor wafers. It specifies that wafer flatness should be determined either by the method outlined in ASTM Test Method F1530 or by another method as agreed upon between the supplier and the purchaser. ASTM Test Method F1530 is now known as SEMI STD MF1530-02, TEST METHOD FOR MEASURING FLATNESS, THICKNESS, AND THICKNESS VARIATION ON SILICON WAFERS BY AUTOMATED NONCONTACT SCANNING (© SEMI) (hereinafter SEMI MF1530-02).

SEMI MF1530-02 specifies determining flatness of a wafer as it would appear relative to a specified reference plane when the back surface is ideally flat, as when pulled down onto an ideally clean, flat chuck. In the method described therein, an opposed pair of probes scans the front and back surface along a prescribed pattern. The data so obtained is constructed into a thickness data array, which represents the front surface as it would appear when the back surface is ideally flat. With the definition of an evaluation area and a reference plane, the thickness data array may be used to calculate surface flatness of the wafer within the evaluation area. An analogous wafer evaluating method is also described in U.S. Pat. No. 4,860,229, issued Aug. 22, 1989, and entitled WAFER FLATNESS STATION, which is hereby incorporated by reference.

An illustrative semiconductor wafer surface 100 for which flatness could be evaluated in accordance with SEMI STD M1-1103 and SEMI MF1530-02 is shown in FIG. 1. The surface 100 has a front surface F, a back surface B, an edge 150, and a fixed quality area 120, also known as FQA 120, which is the central area of a wafer surface 100 and an area of chief interest to manufacturers. The wafer surface area outside the FQA 120 is the edge exclusion region 140, defined by an edge exclusion, XX, extending inwardly from the edge 150. Currently, common edge exclusion is 2-3 mm. As semiconductor production improves, the length of the edge exclusion is expected to decrease. The Semiconductor Industry Association predicts that the edge exclusion length will be 1 mm by the year 2007.

Typically, the wafer surface is organized into a Cartesian grid of sites having areas measuring, for example, 26 mm by 8 mm. FIG. 2 shows a portion of a Cartesian grid defined (but not shown to scale) on the wafer of FIG. 1. Sites are defined to be rectangular areas with centers that fall within the FQA 120. Areas in FIG. 2 with centers (represented by a point) within FQA 120 that are defined as sites include sites 13*a* and 13*b*. Areas in FIG. 2 with centers (represented by a point) outside of FQA 120 that are not defined as sites include non-site areas 13*c* and 13*d*.

Which evaluation area and deviation surface to choose in order to judge flatness depends upon the specifications of the electronic circuit device fabrication system for which the wafer is intended, for example a photolithographic processing system. Both SEMI STD M1-1103 and SEMI MF1530-02 specify that the wafer evaluation area could be defined by site, also known as "S"; or globally (encompassing the entire wafer), also known as "G". They also specify relative to which wafer surface the deviation should be evaluated: the front surface, also known as "F", or the back surface, also known as "B".

SEMI STD M1-1103 and SEMI MF1530-02 then identify four options for specifying a reference plane: an ideal back surface (equivalent to the ideally flat surface of a chuck that is holding the surface), also known as "I"; or a plane defined by three points at specified locations on the front surface F of the wafer surface 100, also known as "3"; or a plane defined by a least-squares fit to the front surface F using all points of a fixed quality area on the wafer surface 100, also known as "L"; or a plane defined by a least-squares fit to the front surface F within a site 13*a*, 13*b*, also known as "Q".

A suitable deviation surface from which deviation may be evaluated is then identified. For example, the deviation surface could be coincident with the reference plane. Alternatively, while it is not necessary, the deviation surface could be defined, as in SEMI STD M1-1103 and SEMI MF1530-02, to be that plane parallel to the reference plane but having zero deviation from the wafer surface at the center point of the evaluation area.

Deviation is then calculated point by point between the surface of the wafer and the deviation surface. Finally, the deviation is presented either as the range of deviation from the reference plane, also known as "R"; or as the maximum deviation from the reference plane, also known as "D".

One common set of conditions used by manufacturers to evaluate flatness is known as SFQR:

S=the wafer is evaluated by sites on the wafer;

F=the reference plane is constructed relative to the front surface of the wafer;

Q=the reference plane is defined by a least-squares fit to the front surface using all points of a site 13a; and R=the results are presented as the range of deviation from the deviation surface.

A significant drawback to using the conventional methods to evaluate semiconductor wafer flatness is that the test methods of U.S. Pat. No. 4,860,229, SEMI STD M1-1103 and SEMI MF1530-02 specifically cover procedures that, once the FQA 120 is defined, evaluate the flatness of the wafer in such a way that the boundary of the wafer is not considered. The flatness evaluation methods defined therein are defined intentionally to evaluate flatness independent of wafer boundary. However, given that wafers do have a boundary, wafer boundary affects flatness evaluation, especially within the area of the FQA 120 near the edge exclusion region 140. Flatness evaluation of such area using the test methods of U.S. Pat. No. 4,860,229, SEMI STD M1-1103 and SEMI MF1530-02 will be incomplete and inexact. Further, the imposition of a grid defined by Cartesian coordinates upon a generally disc-shaped surface results in sites of different geometries and orientation relative to each other.

Referring to FIG. 2, because semiconductor wafers are generally disc-shaped, a portion of the area of certain sites will be beyond the FQA 120 or even beyond the edge 150 of the wafer. A site having its entire area falling within the FQA 120, such as site 13a, is called a full site, and a site without its entire area falling within the FQA 120, such as site 13b, is called a partial site. While SEMI STD M1-1103 and SEMI MF1530-02 provide for optional inclusion or exclusion of partial sites in flatness evaluation, non-site areas near or at the edges of the wafer are not evaluated.

Referring to FIG. 2, a grid area having a center that falls outside the FQA 120, such as area 13c (which has a center within edge exclusion region 140) or area 13d (which has a center beyond the edge 150), is not considered a site, and is typically not evaluated. Therefore, limitations in the definitions outlined in SEMI STD M1-1103 of areas near or at the edge cause evaluation of flatness near or at the edge to be incomplete and inexact.

Further, the characteristics of rectangular sites situated in similar radial locations on the wafer surface 100 will not be comparable, because the orientation of those areas with respect to the wafer is dissimilar. For example, referring to FIG. 1, sites 13e, 13f (not shown to scale) are both located close to the edge 150 but at a radial location 90 degrees apart. As can be seen in FIG. 1, the areas of sites 13e, 13f are not oriented similarly on the wafer surface 100. Most of the area of site 13e is close to the edge 150, while more of the area of site 13f is internal to the wafer surface 100. Therefore, the metrics from the sites 13e, 13f will not be comparable, because the evaluation areas on the sites 13e, 13f are not comparable, given the disc shape of the wafer.

If, for example, the wafer surface 100 has a topographical feature, such as a ridge 51, a portion of which is shown generally as a dashed line in FIG. 1, that extends around the wafer surface 100 circumferentially but interior to the wafer edge, the feature would extend across the rectangular sites 13e, 13f at different locations. The rectangular site 13e, 13f would provide a different measure of certain metrics, such as SFQR. In addition, data values about the ridge 51 on the wafers 13e, 13f would not be comparable because the data locations of the ridge 51 on the sites 13e, 13f are not comparable. The methods described above do not take account of the edge of the wafer, in particular its radius, and how wafer edge affects the area being evaluated, despite the importance of the wafer edge to the evaluation of flatness in certain regions of the wafer.

Thus, it is apparent that the methods described above do not define methods that provide appropriate characterization of a semiconductor wafer near or at its edge, that provide exact characterization of a semiconductor wafer relative to its edge, or that allow comparison between or among selected areas of a wafer relative to their location on the wafer relative to the edge With the development of improved photolithography methods, characterizing a semiconductor wafer near and at its edge is becoming of increasing importance. Edge flatness evaluation methodologies, which are not defined by SEMI STD M1-1103 and which provide information about the amount of roll off of the wafer surface at or near the edge, as compared to the surface within the FQA 120, have been developed.

One such system is described in Kimura et al., "A New Method for the Precise Measurement of Wafer Roll Off of Silicon Polished Wafer", 38 *Jpn. J. Appl. Phy.* 38 (1999). In Kimura, a stylus profiler and a block gauge evaluate the profile of a wafer's surface (known as edge roll off) near the edge of the wafer. A wafer is placed on an optical flat so that the physical edge of the wafer touches a block gauge. The stylus of the profiler moves along the block gauge, and drops off the gauge at the physical edge of the wafer. As the stylus moves along the surface of the wafer toward the center, it measures the displacement z between the actual height of the wafer within the FQA and the height of the wafer below the stylus. Kimura defines a metric known as the roll off amount (ROA), which is the amount of displacement z relative to a reference line when the stylus is located 1 mm from the physical edge.

Another system is described in U.S. Ser. No. 10/203,882, entitled Wafer Shape Evaluating Method and Device Producing Method, Wafer and Wafer Selecting Method, filed Nov. 15, 2001 (hereinafter "Kobayashi et al."). In Kobayashi et al., the flatness of an area at a wafer's edge is determined by extrapolating known surface characteristics into areas having unknown characteristics. A first region is provided within a wafer surface, and a reference line or a reference plane is calculated in the first region. A second region is then provided outside the first region, and the reference line/plane is extrapolated into the second region. Finally, the displacement z is determined between the configuration of the second region and the reference line/plane within the second region.

While the Kimura et al. and Kobayashi et al. methodologies provide some evaluation of the wafer edge that would not otherwise be able to be evaluated, their usage poses certain difficulties. They neither develop metrics nor statistics relating to the topography of the surface of wafer regions near or at the wafer edge. Therefore, their uses in wafer characterization of the edge are limited.

Other systems evaluate the edge of a wafer. Found in the field of edge profilometry, systems such as those developed by Chapman Instruments develop a two-dimensional profile of radial segments around an edge, providing a 2-D data set for a line extending along the radius of an edge and the displacement z from the line and an ideal line extending from the internal part of the wafer. While edge profilometers are thus able to map roll-off of radial lines near the edge of a wafer, like Kimura et al. and Kobayashi et al., they develop neither metrics nor statistics relating to the topography of the surface of wafer regions at or near a wafer edge. Therefore, their uses in wafer characterization of the edge are also limited.

It is therefore desirable to provide an improved methodology for evaluating the flatness of a semiconductor wafer, in particular to provide a methodology for evaluating the flatness of the entire extent of a semiconductor wafer.

Further, it is desirable to provide a methodology for accurate and complete evaluation of the flatness of a wafer at and near its edges, including the areas of a wafer that would not obtain complete and exact characterization should a conventional flatness evaluating technique be applied to the wafer.

Finally, it is desirable to provide a methodology for evaluating the flatness of a semiconductor wafer to allow comparison between or among selected areas of a wafer that are definable with respect to the edge of the wafer.

SUMMARY OF THE INVENTION

A method for evaluating characteristics of a surface of a sample having an edge, comprises selecting an evaluation area of a sample such that the evaluation area has an area surface and a boundary, with at least one portion of the boundary being definable with reference to the edge, and evaluating characteristics of the area surface.

In a further aspect of the invention, a method for evaluating the flatness of a surface of a sample having a shape with an edge comprises selecting an area of the sample such that the area has an area surface and a location that is defined with reference to the edge of the sample, and evaluating flatness of the area by evaluating deviation between the area surface and a deviation surface.

In a further aspect of the invention, the deviation surface is selected based on edge-specific evaluation conditions, which could comprise the definition of evaluation area, a fitted reference surface for use in developing the deviation surface, the deviation surface itself, and a metrics calculation format with which to present the sample characteristics. The evaluation area definition could comprise one of the set of an annulus centered around a center point of the sample and an annular sector defined with respect to the center point.

In a further aspect of the invention, the area of the sample has a boundary, with a portion of the boundary defined with reference to the edge of the sample.

In a further aspect, the sample is generally disc-shaped and has a center point, and selecting the evaluation area could also comprise defining the portion of the boundary with reference to said edge as a first arc at a first radial distance from the center point. Selecting the evaluation area could also comprise defining a second portion of the boundary as a second arc at a second radial distance from the center point, with the second radial distance being shorter than the first radial distance.

In a further aspect of the invention, the location of the area could be defined on the sample in polar coordinates. In a further aspect, the surface comprises a semiconductor wafer. In addition, the evaluation area could be defined as extending from a fixed quality area boundary of the wafer at a first radial distance from the wafer center point to an inner boundary that is a second radial distance from the center point, with the second radial distance being shorter than the first radial distance.

In another aspect of the invention, selecting an area further comprises selecting an annular sector as the evaluation area. Sub-areas within the annular sector could be defined to comprise a first annular sector and a second annular sector. Each first annular sector and said second annular sector could have an inner arc, an outer arc, and side boundary portions, and the inner arc of the first annular sector could be coincident with the outer arc of the second annular sector.

Alternatively, selecting an area further comprises selecting an annulus as the evaluation area. Sub-areas within the annulus could be defined to comprise a plurality of annular sectors extending along the annulus. In an illustrative but not necessarily preferred embodiment, the sub-area annular sectors have a circumferential angular length of 5 degrees.

Another aspect of the invention involves a method of evaluating flatness of a surface of a sample having an edge, comprising selecting an area of the sample such that the area has an area surface and a boundary, with a portion of the boundary defined with reference to the edge of the sample, and evaluating the flatness of the area by evaluating deviation between the evaluation area surface and a deviation surface. The deviation evaluation could comprise using edge-specific metrics to quantify parameters for the evaluation area.

In one aspect, the portion of the boundary extends along the evaluation area at a fixed distance from the sample's edge. In another aspect, the sample is generally disc-shaped and has a center point, and the boundary portion extends along the boundary of the evaluation area at a fixed distance from the center point.

In another aspect of the invention, there is disclosed a software program product for evaluating the geometry of a surface of a sample, with the sample having an edge, embodied on a computer readable medium and implemented in a series of instructions. The instructions comprise selecting an evaluation area having an area surface and a location that is definable with reference to the edge; selecting a deviation surface; and calculating deviation between the area surface and deviation surface. The set of instructions for evaluation area selection could comprise a defining a portion of a boundary of the evaluation area with reference to the edge. The set of instructions for defining the boundary portion could comprise extending the portion along the evaluation area at a fixed distance from the sample edge.

In another aspect of the invention, there is disclosed a software program product for measuring deviation between a surface of a sample and a deviation surface, with the sample having an edge, embodied on a computer readable medium and implemented in a series of instructions. The instructions comprise selecting an sample evaluation area with an area surface and a location that is defined with reference to the edge, selecting deviation surface based on edge-specific evaluation conditions; and calculating deviation of evaluation area surface from deviation surface.

In another aspect of the invention, there is disclosed a method of measuring deviation between a surface of a sample and a deviation surface, with the sample having an edge, comprising a step for selecting an evaluation area, a step for selecting a deviation surface based on edge-specific evaluation conditions; and a step for calculating deviation of area surface from deviation surface. The edge-specific evaluation conditions could comprise selecting the evaluation area having a boundary that is definable with reference to the edge.

In addition, selecting the deviation surface could comprise selecting a fitted reference surface and defining the deviation surface relative to said fitted reference surface. The fitted reference surface could comprise a planar fitted reference surface or a conical fitted reference surface, with the conical fitted reference surface comprising a portion of a conical surface, not including the base. The deviation surface could comprise a coincident deviation surface (in which the deviation surface is coincident with the fitted reference surface). Alternatively, the deviation surface could comprise a displaced deviation surface (in which the deviation surface is displaced a selected distance from the fitted reference surface).

The displaced deviation surface could be thus defined as a plane that is parallel to a planar fitted reference surface but having zero deviation from the sample surface at a center point of the annular sector. Alternatively, the deviation surface could be defined as a conical surface portion having coefficients a and b equal to coefficients a and b of a conical fitted reference surface, but displaced from the conical fitted reference surface such that the conical portion has zero deviation from the sample at a center point of the annular sector comprising the evaluation area.

In another aspect of the invention, there is disclosed a method of evaluating characteristics of a surface of a sample having an edge comprising selecting a first area and a second area, each with a boundary, with a portion of each boundary defined with reference to the edge of the sample; evaluating the first area in order to obtain first characteristics results and evaluating the second area in order to obtain second characteristics results.

The first area and said second area could each have an inner arc and an outer arc, with the first area inner arc comprising the second area outer arc. In one embodiment, the first area and said second areas each have equal area; in another embodiment, they each have side boundary portions extending from inner arc to outer arc that are equal in length.

Another aspect of the invention discloses a system for evaluating characteristics of a sample having a surface with an edge, comprising a data collection system for generating data values for selected locations on the surface; and a data analyzing system for analyzing data values to determine characteristics of the sample, further comprising a system for organizing a surface area of a sample into a grid of areas each area having a boundary, a portion of each boundary being definable d with reference to the edge of the sample. The data analyzing system could comprise a system for developing an evaluation area for the sample that is defined relative to the edge and for applying edge-specific evaluation conditions to use edge-specific metrics to evaluate the evaluation area. In one embodiment, evaluating characteristics comprises evaluating sample flatness, and the data analyzing system further comprises a flatness analyzing system for determining flatness of the sample relative to a deviation surface.

In another aspect of the invention, there is defined, on the wafer surface, an annulus, which is the figure bounded by and containing the area extending from a wafer's FQA boundary to an inner smaller radius than the FQA boundary. A plurality of annular sectors is then defined along an annulus. In a further embodiment, each sector has a circumferential angular length of 5 degrees.

In another embodiment of the present invention, a plurality of annular sectors is defined within a sector extending from a selected radius to the center of the wafer. A first annular sector is defined extending from a first radius to an intermediate radius shorter than the first radius, and a second annular sector is defined extending from the intermediate radius to an inner radius shorter, than the intermediate radius. In one aspect of the further embodiment, the first annular sector and second annular sector have equivalent radial length. In another aspect, the first annular sector and second annular sector have equivalent areas.

Finally, there is described a method of evaluating deviation between a surface of a sample and a deviation surface, with the sample having a shape with an edge. The method comprises selecting an area of the sample for evaluation, with the area having an area surface and a location that is defined with reference to the sample edge, selecting the deviation surface; and evaluating deviation between the area surface and the deviation surface.

It can be seen that the method and systems described herein extends the known flatness evaluating methodologies to take into account the edge of the wafer, with the location of the area of the sample undergoing evaluation being defined with reference to the edge of the sample, and, in the case of one embodiment, in polar coordinates. Therefore, in one embodiment, the invention comprises determining flatness of a semiconductor wafer by evaluating the deviation of the surface of an area of the wafer relative to a deviation surface, wherein the area is defined by polar coordinates.

BRIEF DESCRIPTION OF THE DRAWINGS

FIG. 12 is a flow chart of another method for acquiring wafer data for locations defined by polar coordinates;

FIGS. 15a through 15g are tables of edge-specific evaluation conditions, metrics, and statistics of the present invention;

FIG. 23 is a flow chart of the step 714 for defining fitted reference surfaces shown in FIG. 22;

FIG. 25 is a flow chart of the step 713b for defining conical fitted surfaces shown in FIG. 23.

DETAILED DESCRIPTION OF THE INVENTION

Figure 1:
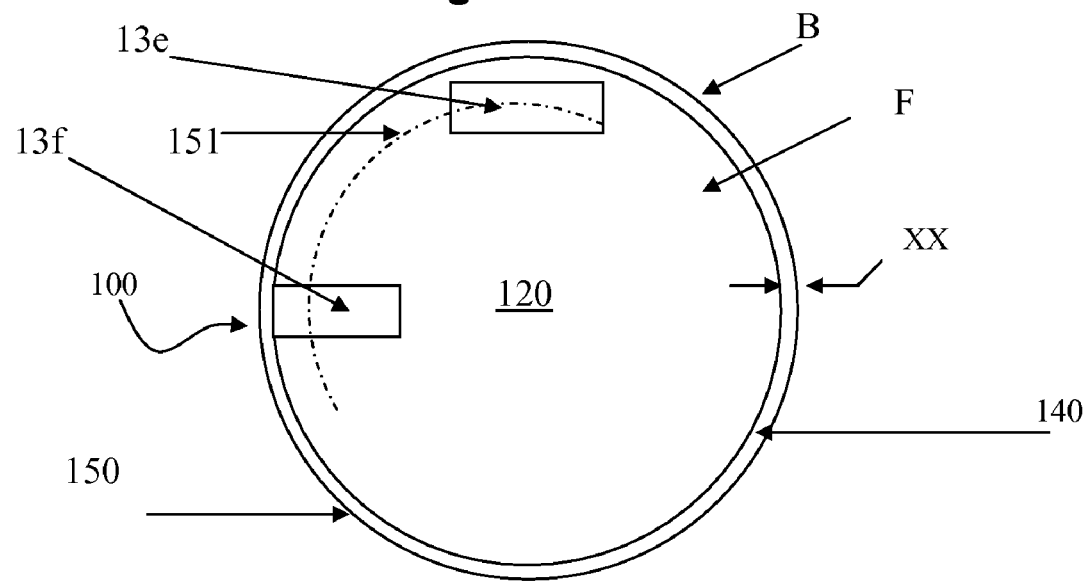
FIG. 1 is an explanatory view showing an example of a semiconductor wafer surface 100.
Figure 2:
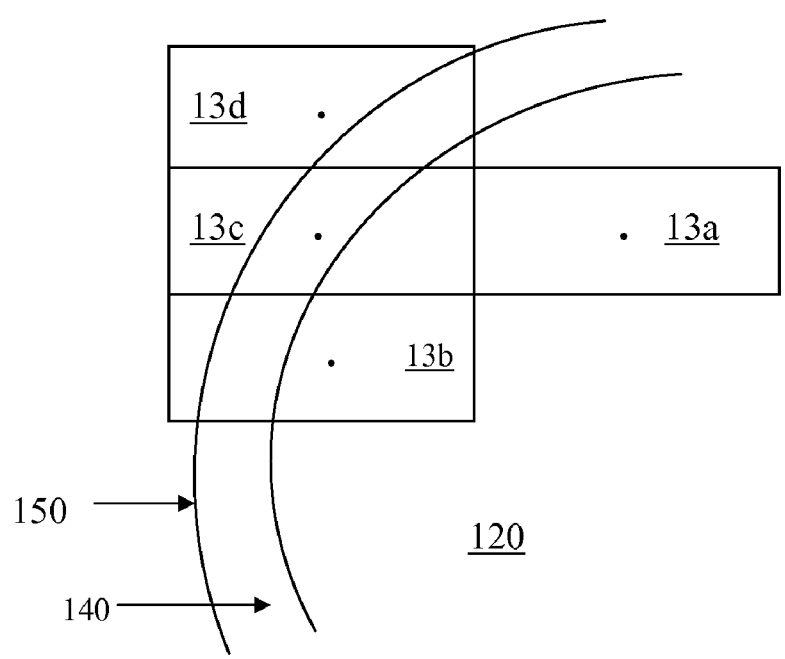
FIG. 2 is an explanatory view showing a portion of a Cartesian grid defined (but not shown to scale) on the wafer surface 100 of FIG. 1.
Figure 3:
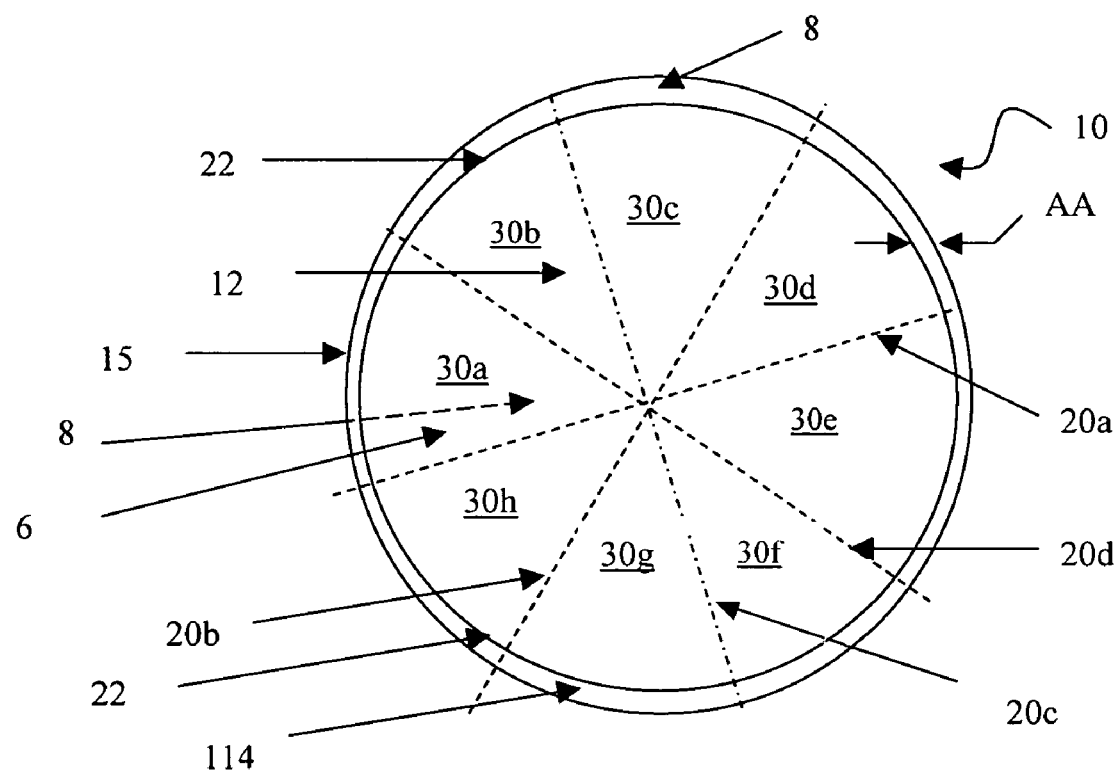
FIG. 3 is an explanatory view showing an example of a semiconductor wafer 10 to be evaluated according to the present invention.
Figure 21:
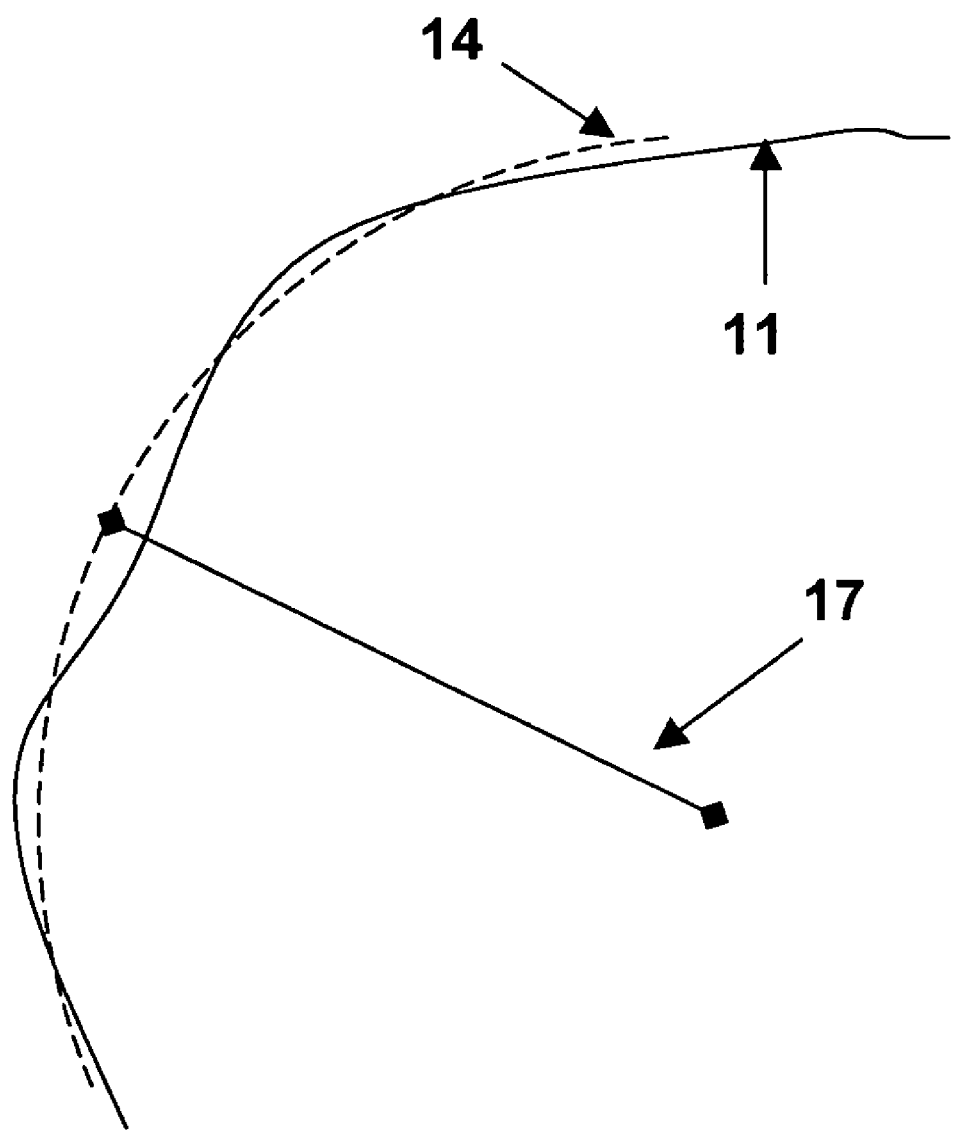
FIG. 21 is an explanatory view of the edge 15 of the wafer 10 of FIG. 3.

Referring to FIG. 3, there is shown a semiconductor wafer generally designated as 10 to be evaluated according to the present invention. Wafer 10 has a front surface 6, a back surface 8, and a periphery 15, also known as edge 15. Recognizing that the wafer 10 is generally but not perfectly circular, as shown in FIG. 21, the edge 15 may be a physical edge 11 of the wafer 10 or, as in an illustrative but not necessarily preferred embodiment, it may be a nominal edge 14 that is a selected radial distance 17 from the center of the wafer 10.

Wafer 10 has fixed quality area 12, also known as an FQA 12, extending from the center of the wafer 10 to an FQA boundary 22. The wafer surface area outside the FQA 12 is the edge exclusion region 114, which is an annulus of the wafer 10 defined by the FQA boundary 22 and the edge 15. The edge exclusion region 114 has an edge exclusion, M, the radial length of which may be any value from 0 up to the length of the radius of the wafer 10, but, in the illustrative but not necessarily preferred embodiment, is defined to be either 1, 2, or 3 mm.

Figure 4:
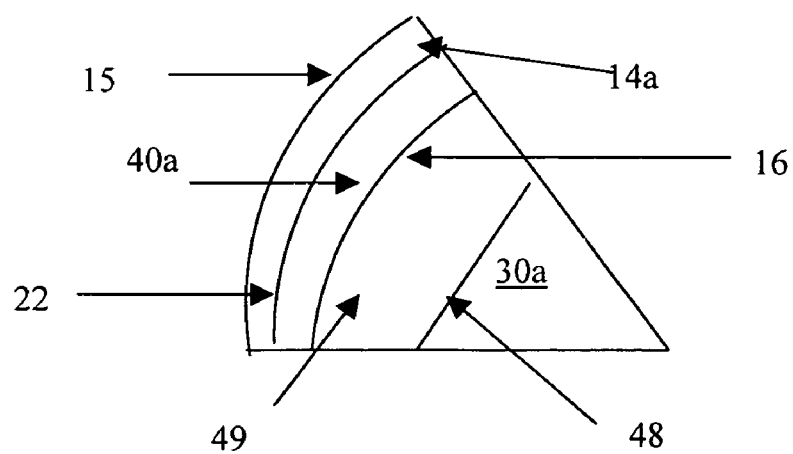
FIG. 4 is an explanatory view showing an annular sector formed from sector 30a shown in FIG. 3.

Wafer 10 has sectors 30a, 30b, 30c, 30d, 30e, 30f, 30g, and 30h derived from diameters 20a, 20b, 20c, and 20d and the included arcs along edge 15. FIG. 4 shows sector 30a divided into annular sectors 14a, 40a. Edge exclusion annular sector 14a is the annular sector extending from the periphery 15 to the FQA boundary 22. FQA annular sector 40a is the annular sector extending from the FQA boundary 22 to a radius 16 that is interior to FQA boundary 22.

Figure 5:
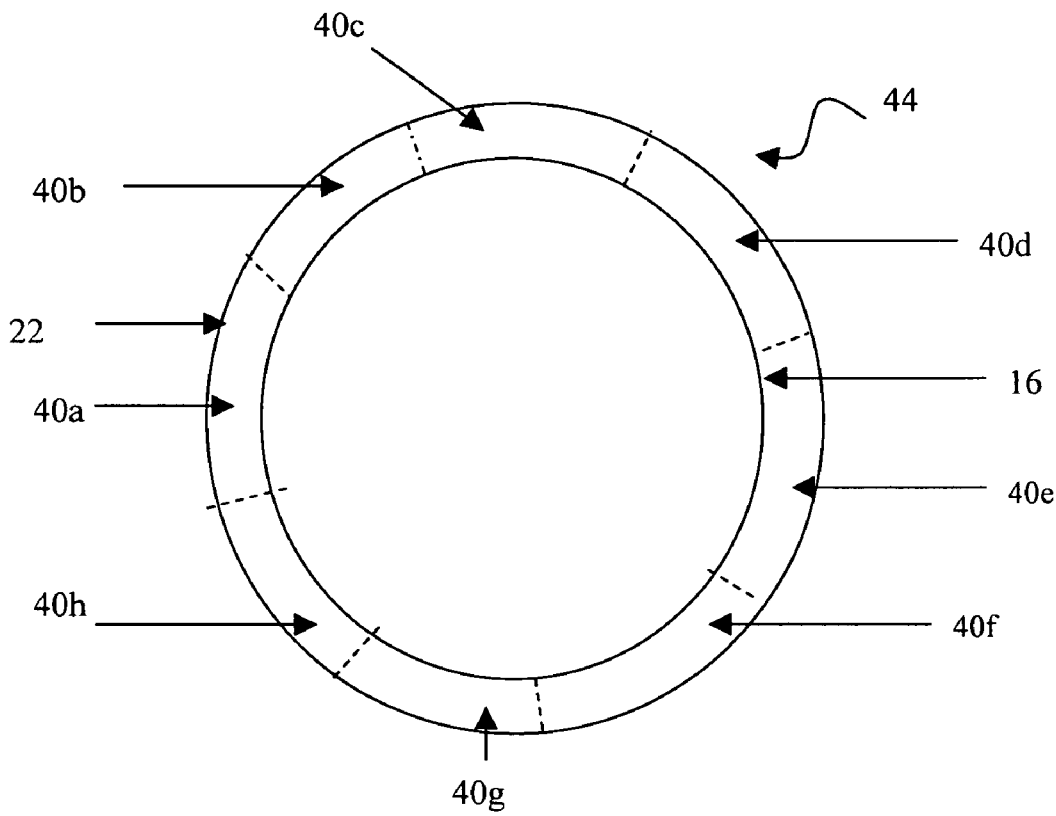
FIG. 5 is an explanatory view showing a plurality of annular sectors formed from an annulus of wafer 10 shown in FIG. 3.

As seen in FIG. 5, wafer 10 has an annulus, shown generally as 44 and also known as zone 44. Zone 44 may be defined using a selected radius 16 and the FQA boundary 22 of the wafer 10. Alternatively, zone 44 may be defined by the FQA boundary 22 and a selected radial length extending from the FQA boundary 22 a selected distance toward the center of the wafer 10. The annulus 44 is divided to form evaluation areas 40a, 40b, 40c, 40d, 40e, 40f, 40g and 40h having a geometry that is defined with reference to the edge 15 of the wafer 10.

Figure 16:
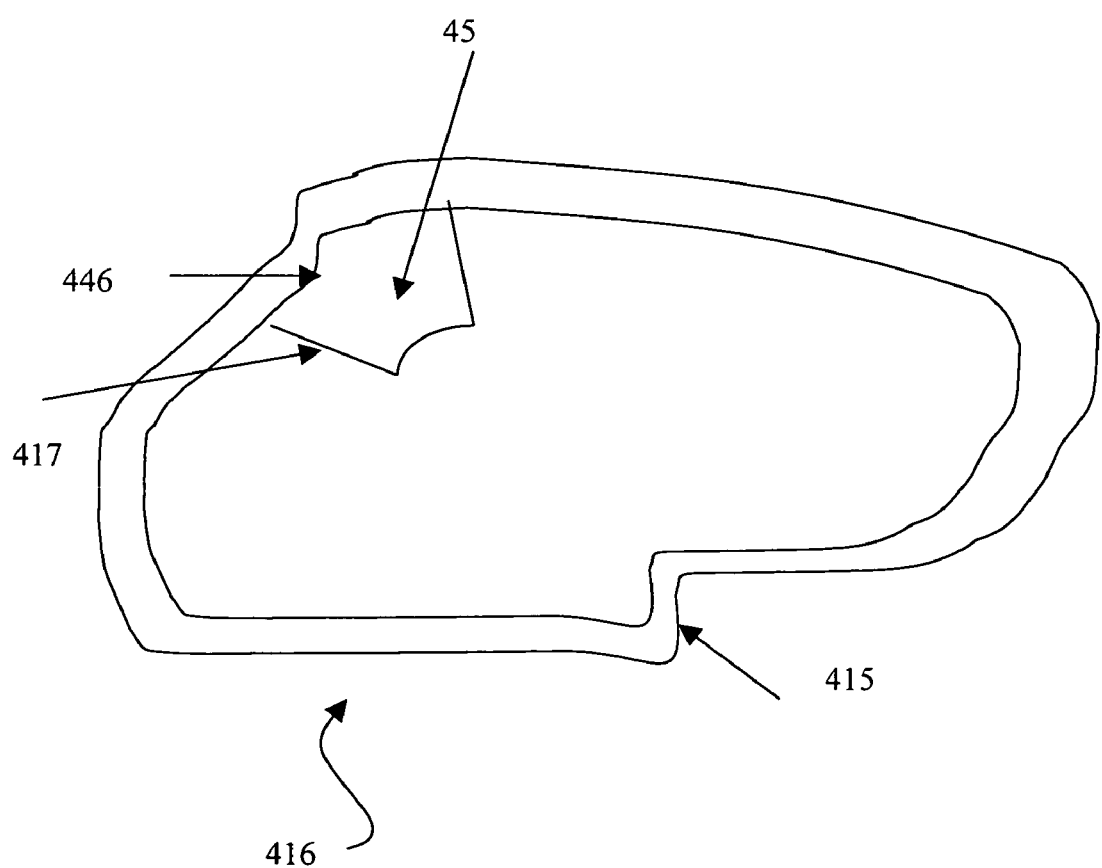
FIG. 16 is an explanatory view showing a generalized version of the wafer 10 shown in FIG. 3.

Referring to FIG. 16, which shows a generalized version of a sample 416 and an area 45 having a geometry that is defined with reference to the edge 415, analogously to the areas shown in FIGS. 3 and 5, the geometry of an area 45 could have any geometry, so long as at least one portion of its boundary 417 (such as its external side edge 446) is defined with reference to the edge 415 of the sample 416, for example, extending along the sample at a selected distance from the edge 415.

Figure 17:
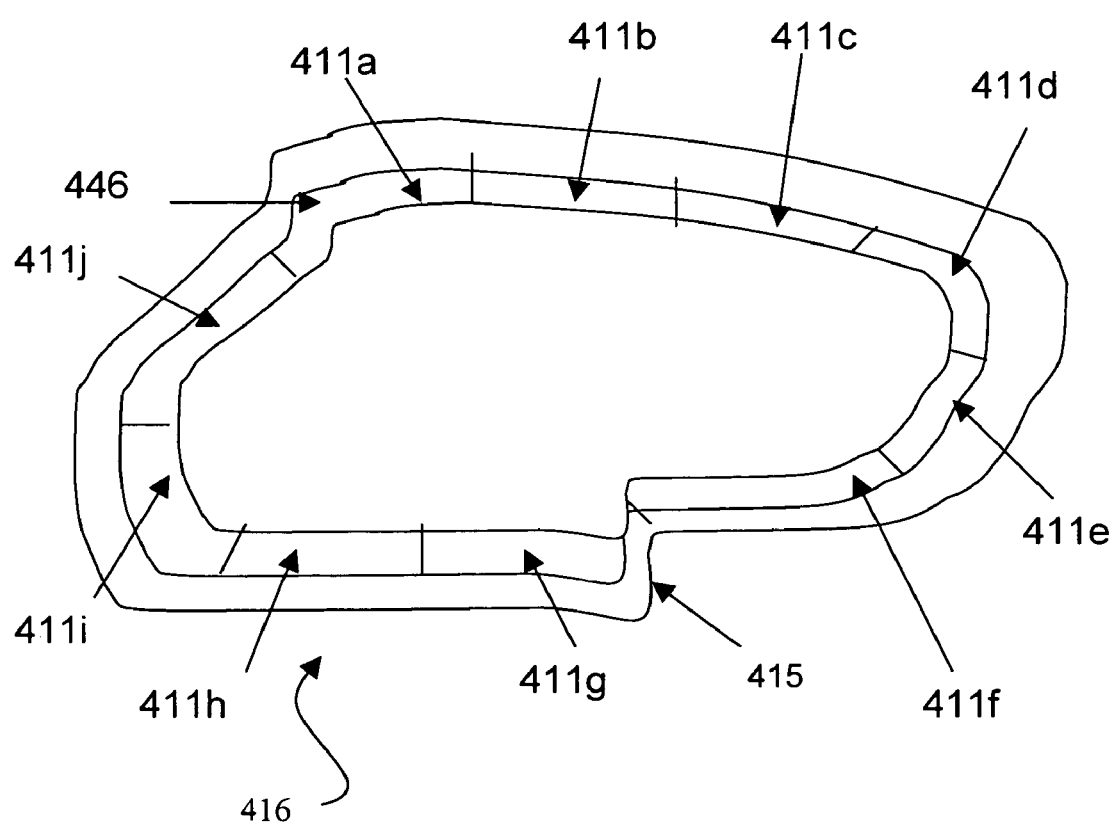
FIG. 17 is an explanatory view showing the generalized sample 416 shown in FIG. 16.

Referring to FIG. 17, a generalized version of defining a set of evaluation areas is shown. The sample 416 of FIG. 16 is shown as having evaluation areas 411a, 411b, . . . , 411j, each of which with equal area and containing all points of the sample 416 that are less than a selected distance from the external side edge 446 but that are not included in the region between external side edge 446 and sample edge 415.

Annular Sectors

Returning to FIG. 4, an example of an area having a geometry that is defined with reference to the edge 15 is an annular segment 49, being a portion of the wafer 10 with an upper boundary being a circular arc (a portion of radius 16) and a lower boundary being a chord 48 displaced from the radius 16. In the illustrative but not necessarily preferred embodiment, the FQA areas, shown in FIG. 5, are annular sectors 40a, 40b, 40c, 40d, 40e, 40f, 40g and 40h.

As the wafer 10 is disc-shaped, wafer 10 will have an angular extent of 360°. An annular sector can have any angular extent up to 360°. While it is not required by the invention, in the illustrative but not necessarily preferred embodiment the angular extent of each annular sector may be equal. In one embodiment, the angular extent of each annular sector is equal to 5°, but can extend from to 1° to N°.

Figure 6:
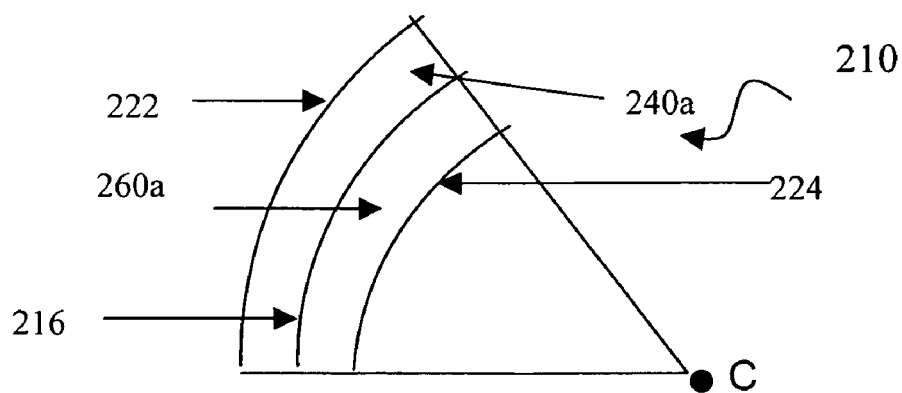
FIG. 6 is an explanatory view showing annular sectors formed from a wafer 210.
Figure 7:
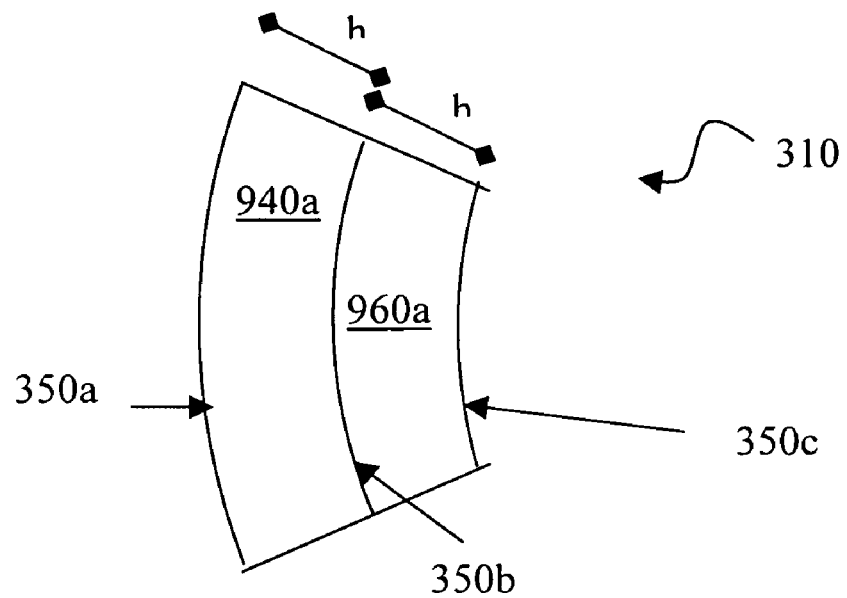
FIG. 7 is an explanatory view showing annular sectors of constant radial length.
Figure 8:
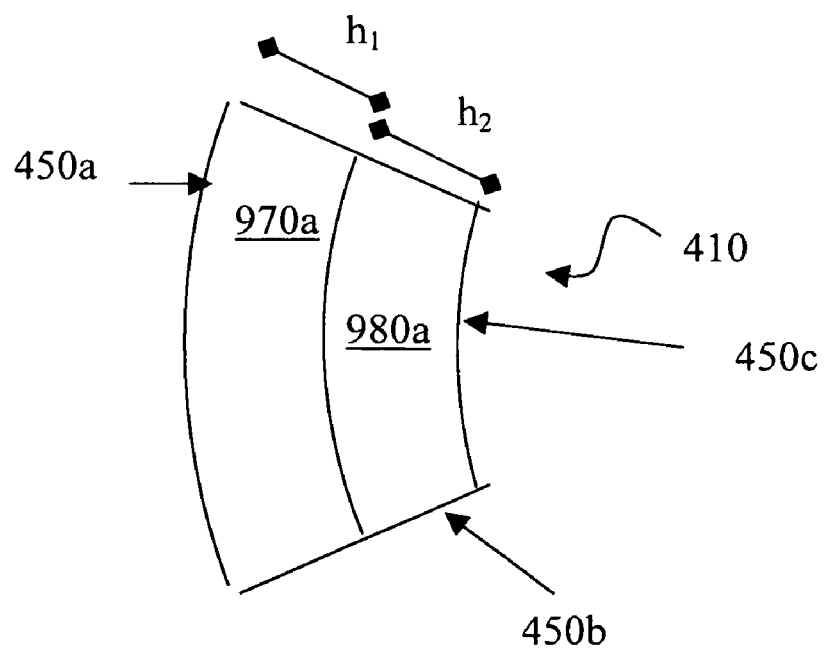
FIG. 8 is an explanatory view showing annular sectors of constant area.

A plurality of annular sectors may also be defined extending from a selected radius to the center of the wafer. A wafer could have any number of annular sectors; the number is user defined. As seen in FIG. 6, a portion of a wafer 210 is shown with an annular sector 240a extending from an FQA boundary arc 222, formed from a portion of the FQA boundary, to an intermediate arc 216 that is a shorter radial distance from the center point C than is the FQA boundary arc 222. An annular sector 260a is defined extending from the intermediate arc 216 to an inner arc 224 that is a shorter radial distance from the center point C than is the radius from arc 216 to center point C. While not required by the illustrative but not necessarily preferred embodiment, annular sectors 940a, 960a may be defined on a wafer 310 as having equal radial length, as seen in FIG. 7. Alternatively, while not required by the illustrative but not necessarily preferred embodiment, annular sectors 970a, 980a may be defined on a wafer 410 as having equal area, as seen in FIG. 8.

In FIG. 7, annular sectors 940a, 960a each have a radius of 10 mm. Each annular sector 940a, 960a has a maximum radius $r_{max}$ and a minimum radius $r_{min}$ that are calculated using the formulae:

Annular sector 940a: $r_{max}=r_{nom}-EE$, $r_{min}=r_{nom}-EE-L_R$

Annular sector 960a: $r_{max}=r_{nom}-EE-L_R$, $r_{min}=r_{nom}-EE-2L_R$ with $r_{nom}$ being the length of the radius of the nominal edge; EE being the length of the edge exclusion, and $L_R$ being the selected radial length. Therefore, with a wafer 310 having a 300 mm diameter ($r_{nom}=150$ mm) and an edge exclusion EE=2 mm, and with annular sectors 940a, 960a having a constant radial length $L_R=10$ mm, annular sector 940a has an $r_{max}$ of 148 mm and an $r_{min}$ of 138 mm; and annular sector 960a has an $r_{max}$ of 138 mm and an $r_{min}$ of 128 mm.

The area A of an annular sector may be calculated using the formula $A=\frac{1}{2} h(s_1+s_2)$, where h is the radial length of the annular sector, $s_1$ is the length of the outer arc, and $s_2$ is the length of the inner arc. When annular sectors share an arc, holding their radial lengths constant results in the area of the outer annular sector being greater than the area of the inner annular sector. Referring to FIG. 7, annular sector 940a is defined by a radial length h, an outer arc 350a of length $s_1$, and intermediate arc 350b of length $s_2$. Annular sector 960a is defined by a radial length h, intermediate arc 350b of length $s_2$, and an inner arc 350c of length $s_3$. The length $s_2$ of intermediate arc 350b is necessarily shorter than the length $s_1$ of outer arc 350a and is necessarily longer than the length $s_3$ of the inner arc 350c. Therefore, holding the radial lengths of annular sectors 940a, 960a constant at 10 mm results in the area A1 of annular sector 940a being greater than the area A2 of annular sector 960a.

Similarly, holding constant the areas of annular sectors that share an arc results in the radial length of the inner annular sector being greater than the radial length of the outer annular sector. In FIG. 8, annular sectors 970a, 980a have constant areas. With a wafer 410 having a 300 mm diameter, an edge exclusion of 2 mm, and annular sectors of 5° angular extent, when the radial length of annular sector 970a is 10 mm, holding the areas of both annular sectors 970a, 980a to a value A results in a radial length of 10.784 mm for annular sector 980a. Therefore, annular sector 970a has an $r_{max}$ of 148 mm and an $r_{min}$ of 138 mm; and annular sector 980a has an $r_{max}$ of 138 mm and an $r_{min}$ of 127.216 mm.

Edge-Specific Flatness Evaluation

When the boundaries of evaluations areas on the semiconductor wafer 10 are defined relative to the edge of the wafer 10, it is now possible to evaluate characteristics such as flatness of wafer regions near or at the edge of the wafer 10. One system for such evaluation, shown as wafer flatness evaluation system 200 in FIG. 9, has a wafer data collection system 60 and a wafer data analyzing system 70 that develops and displays edge-specific metrics 50 that derive from the specification of edge-specific evaluation conditions 151. Edge-specific evaluation conditions 151 may be developed that are analogous to traditional sets of conditions such as those defined by SEMI STD M1-1103 and commonly used by manufacturers to characterize wafers, but also taking into account the boundary of the wafer. Specifically, edge-specific evaluation conditions 151 may be developed which provide accurate and complete evaluation of the flatness of a wafer at and near its edges.

Figure 9:
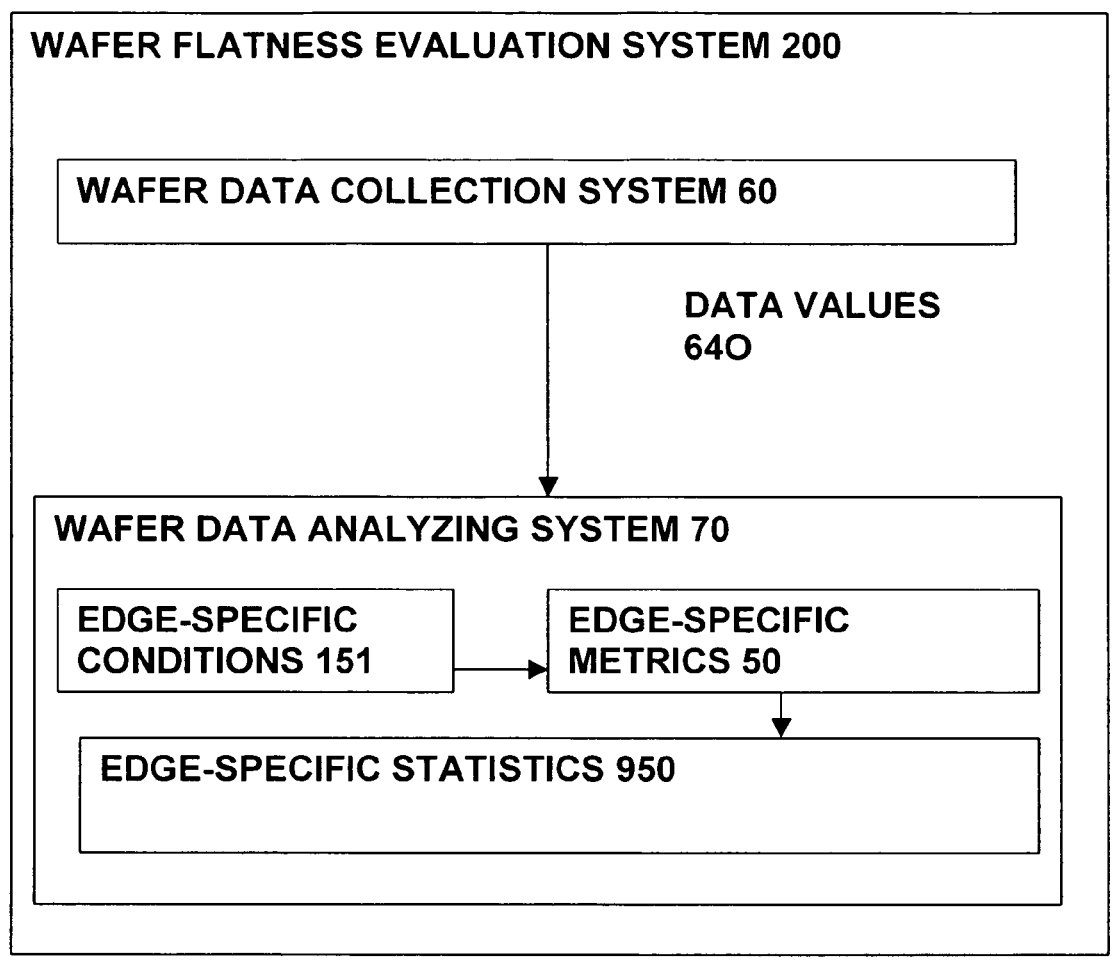
FIG. 9 is a block diagram of a system to evaluate flatness of a semiconductor wafer in accordance with the present invention.

Wafer flatness evaluation system 200 in FIG. 9 implements a flatness evaluation methodology such as that described in U.S. Pat. No. 4,860,229 but that takes wafer boundary into account by developing evaluation areas that are defined relative to the wafer's edge and using edge-specific metrics 50 that are derived from edge-specific evaluation conditions 151.

Edge-specific metrics 50 may be applied to areas that, in the illustrative but not necessarily preferred embodiment, are annular sectors, the areas of which are defined by polar coordinates, to obtain flatness data near the FQA boundary 22 of the wafer 10. Each edge-specific metric 50 is a single value quantifying a parameter for an edge-specific area. Edge-specific metrics 50 are analogous to conventional flatness metrics, in which conventional rectangular sites used in the calculation of conventional flatness metrics are replaced with annular sectors.

Edge-specific statistics 950 are values that are derived from combinations of the edge-specific metrics 50. Each statistic 950 characterizes the set of annuli or annular sectors (for example, the set comprising the wafer 10) from which the statistic was derived. For example, statistics 950 could be the mean or the arithmetic average of a set of evaluation areas.

Edge-Specific Evaluation Conditions 151

The flatness of regions of a semiconductor wafer 10 near its edge is determined according to the present invention by evaluating the point deviation of a wafer surface at each point in an evaluation area 82, using edge specific evaluation 151 conditions that are defined with reference to the edge 15, and where the point deviation is the distance between a point on a wafer surface at the evaluation area 82 and its corresponding point on a deviation surface 86. The point deviation is positive when the point on the evaluation area 82 is above its corresponding point on the deviation surface 86, and it is negative when the point on the evaluation area 82 is above its corresponding point on the deviation surface 86.

Figure 14:
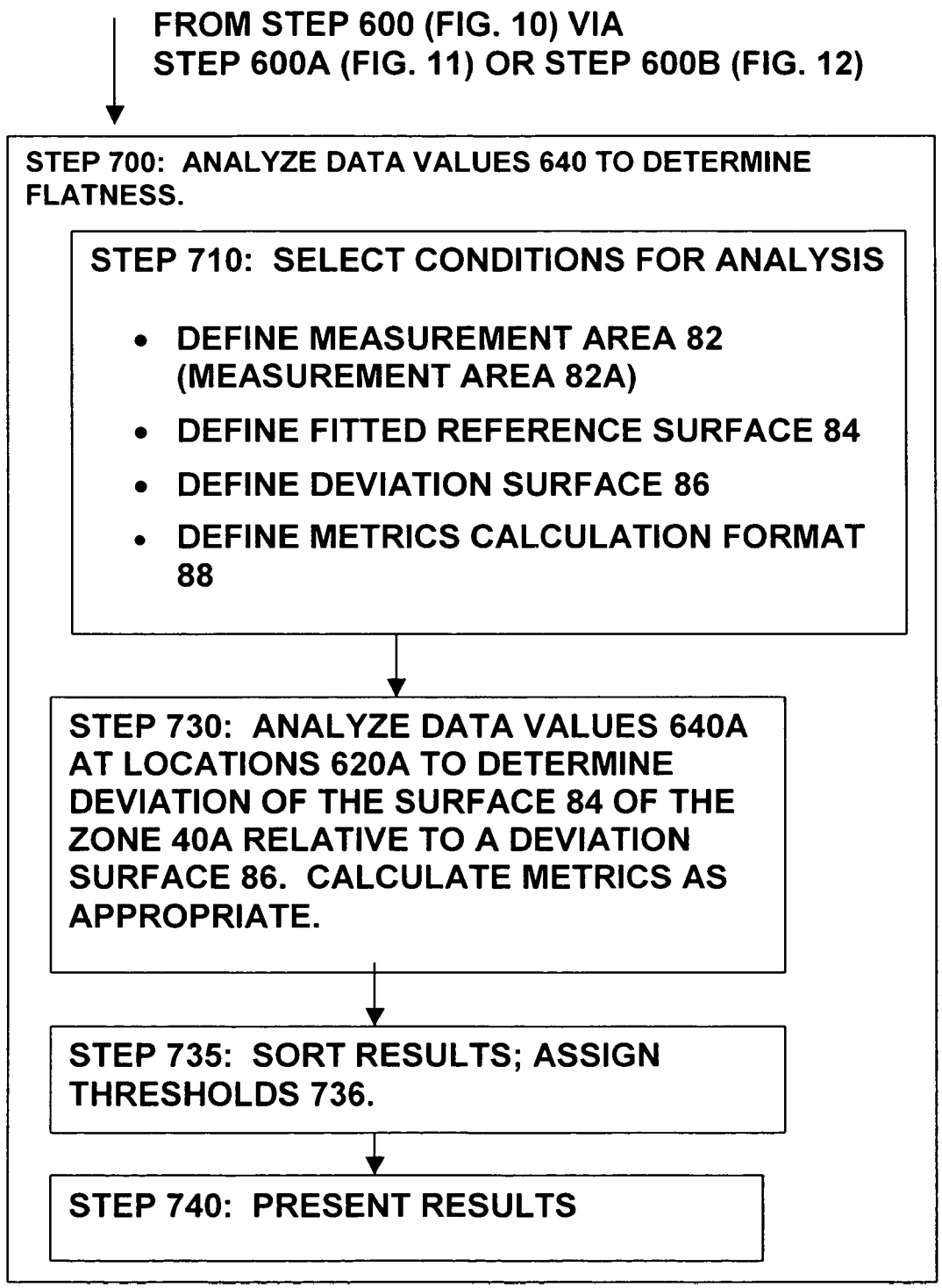
FIG. 14 is a flow chart of the step 700 for analyzing wafer data to determine flatness shown in FIG. 10.

As shown in FIG. 14, selecting the edge-specific evaluation conditions 151 involved in the evaluation of regions near semiconductor wafer edges comprises selecting the evaluation area 82 having an area surface and a location that is defined with reference to the edge of the sample, selecting the fitted reference surface 84 from which a deviation will be derived, and calculating deviation results.

Which evaluation area 82 (also known as measurement area 82), fitted reference surface 84, and deviation surface 86 to choose in order to judge flatness depends upon the characteristics of the wafer 10, its edge 15, and the properties of the evaluating equipment.

Evaluation Area 82

Figure 22:
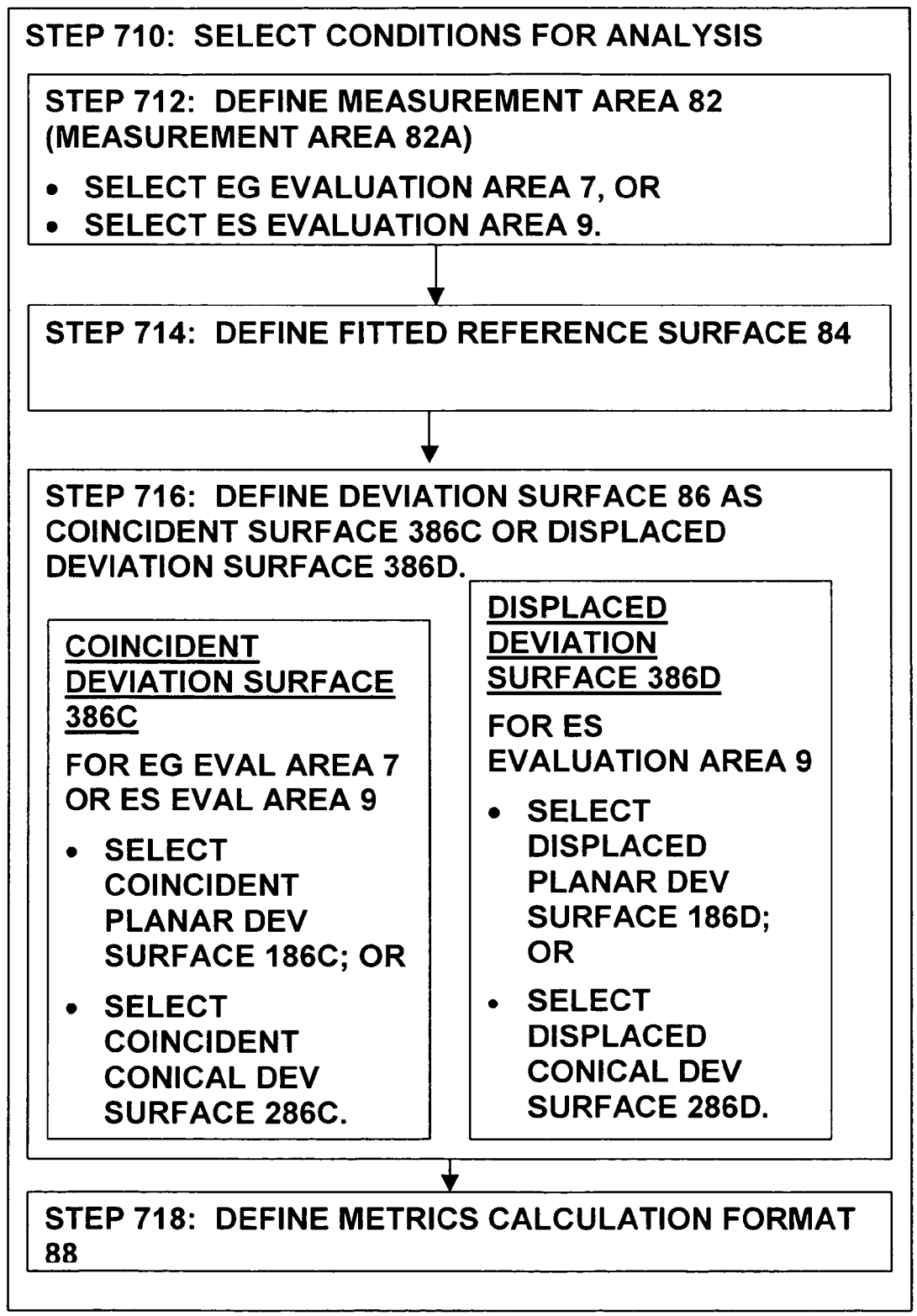
FIG. 22 is a flow chart of the step 710 for selecting edge-specific evaluation conditions shown in FIG. 14.

As shown in FIG. 22, the wafer evaluation area 82 of the present invention, having an area surface and a location that is defined with reference to the edge of the sample, could be defined as an annulus of the wafer, also known as an "Edge Global" evaluation area or EG evaluation area 7, or as an annular sector, known as an "Edge Sector" evaluation area or ES evaluation area 9. The EG evaluation area 7 and ES evaluation area 9 are analogous to the global and site evaluation areas known as "G" and "S" in SEMI STD M1-1103 and SEMI MF1530-02. In the illustrative but not necessarily preferred embodiment, and referring to FIG. 5, the EG evaluation area 7 could be a zone 44 (also known as annulus 44), and the ES evaluation area 9 could be an annular sector such as annular sector 40b.

Fitted Reference Surface 84

Figure 18:
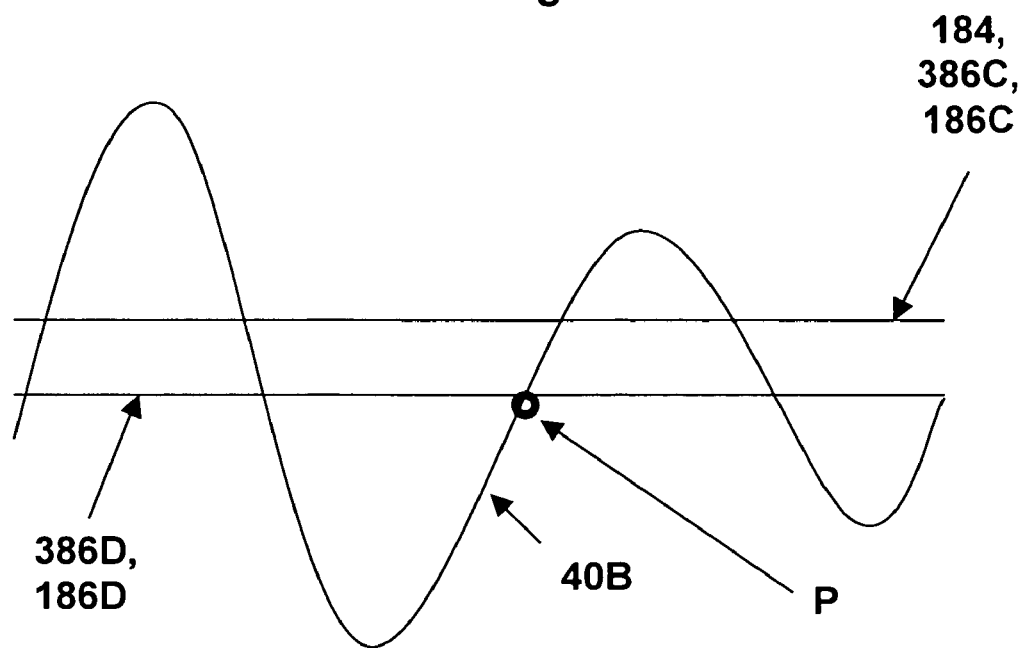
FIG. 18 is a side view of a wafer showing a planar fitted surface and a deviation surface of the present invention.
Figure 19:
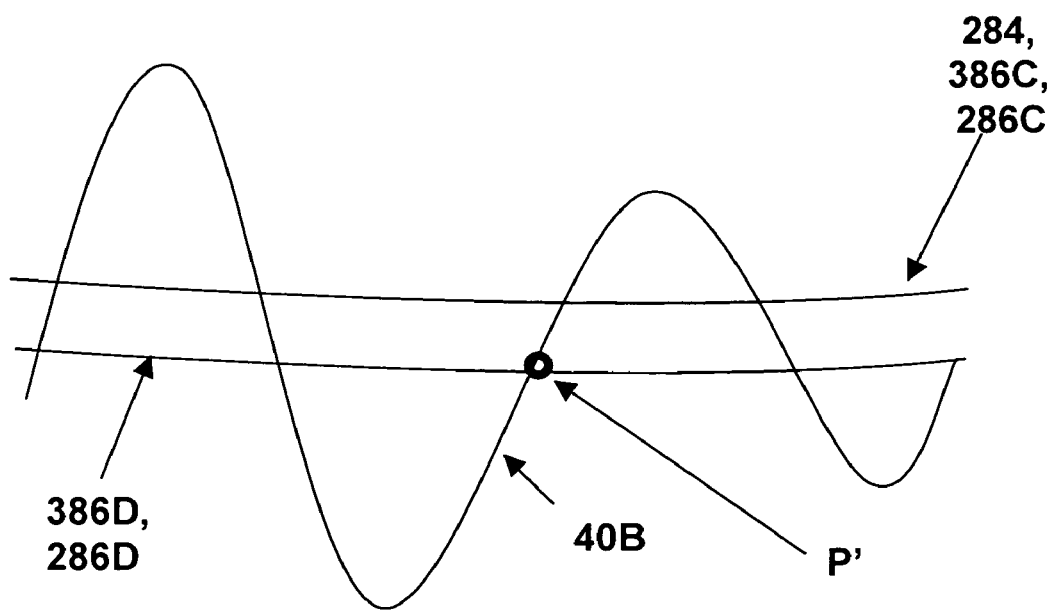
FIG. 19 is a side view of a wafer showing a conical fitted surface and a conical deviation surface of the present invention.

The fitted reference surface 84 is a mathematically constructed surface that could be either two-dimensional in its own coordinate system (known as a planar fitted surface 184 and as shown in FIG. 18) or three-dimensional in its own coordinate system (such as a conical fitted surface 284 and as shown in FIG. 19). The fitted reference surface 84 is defined by an evaluation algorithm 384, described in more detail below in connection with FIGS. 23-25, that takes into account the selected number of dimensions of the fitted reference surface 84. Conventional G or S evaluation areas employ planar fitted surfaces 184; while EG evaluation areas 7 and ES evaluation areas 9 employ either planar fitted surfaces 184 or conical fitted surfaces 284, depending upon the selected number of dimensions of the fitted reference surface 84. The fitted reference surface 84 may be defined to be a planar fitted surface 184 or a conical fitted surface 284.

Planar Fitted Surface 184

Figure 24:
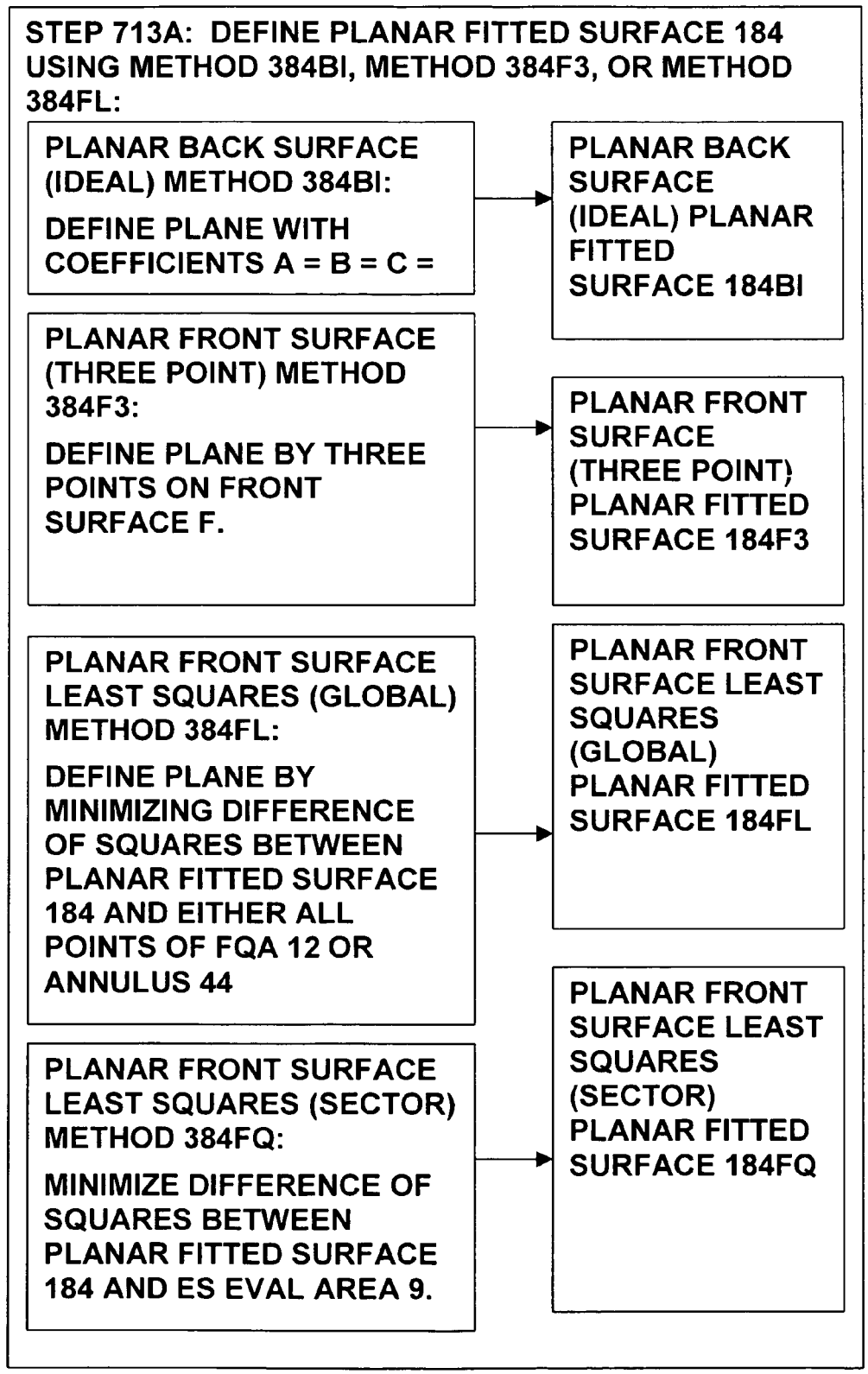
FIG. 24 is a flow chart of the step 713a for defining planar fitted surfaces shown in FIG. 23.

As with reference planes used in conventional flatness evaluation systems, edge-specific planar fitted surfaces 184 are planes defined by the formula: Z=ax+by+c. As shown in FIG. 24, an edge-specific planar fitted surface 184 may comprise one of the following planar fitted surfaces 184, namely a Planar Back Surface (Ideal) fitted surface 184BI, a Planar Front Surface (Three Point) fitted surface 184F3, a Planar Front Surface Least Squares (Global) fitted surface 184FL, and a Planar Front Surface Least Squares (Sector) fitted surface 184FQ, each of which having coefficients a, b, c selected in accordance with its associated type of planar fitted surface 184, using the following method associated therewith:

Planar Back Surface (Ideal) method 384BI: The Planar Back Surface (Ideal) fitted surface 184BI is a planar fitted surface 184 that is defined as an ideal back surface B (equivalent to the ideally flat surface of a chuck that is holding the surface), in which the coefficients a=b=c=0.

Planar Front Surface (Three Point) method 384F3: The Planar Front Surface (Three Point) fitted surface 184F3 is a planar fitted surface 184 that is defined by three points at selected locations on the front surface F of the wafer 10.

Planar Front Surface Least Squares (Global) method 384FL: The Planar Front Surface Least Squares (Global) fitted surface 184 FL is a planar fitted surface 184 that is defined by minimizing the difference of the squares between the planar fitted surface 184 and either all points, or preferably an annulus 44, of a fixed quality area 12 on the wafer 10.

Planar Front Surface Least Squares (Sector) method 384FQ: The Planar Front Surface Least Squares (Sector) fitted surface 184FQ is a planar fitted surface 184 that is defined by minimizing the difference of the squares between the planar fitted surface 184 and the ES evaluation area 9.

Conical Fitted Surface 284

As shown in FIG. 19, an edge-specific conical fitted surface 284 is a portion of the surface of a cone, not shown, not including the base, defined in cylindrical coordinates. The Z value of the conical fitted surface 284 at a point (R, $\theta$) is given by the formula Z=aR+b$\theta$+c, with R being the distance of the point in the r$\theta$ plane from the origin, and with $\theta$ being the angle formed by a line in the R$\theta$ plane connecting the point to the origin and the line forming $\theta$=0, and with Z being the perpendicular distance from the r$\theta$ plane.

In a merely illustratative but not necessarily preferred embodiment, the conical fitted surface 284 comprises a Conical Front Surface Least Squares (Sector) fitted surface 284FQ', having coefficients a, b, c selected using the Conical Front Surface (Least Squares Sector) method 484FQ', which defines the conical fitted surface 284 by minimizing the difference of the squares between the conical fitted surface 284FQ' and the area of the wafer surface within the annulus 44 that either is or contains the defined evaluation area 82.

Note that certain annular sectors 40b may have a tilt. In order to allow the conical fitted surface 284FQ' to match the tilt of an annular sector 40b, it may be necessary for the coefficient b to have a non-zero value. Therefore, in order to avoid the discontinuity of the conical fitted surface 284FQ' if an annular sector 40b contains $\theta$=2$\pi$, the $\theta$ associated with each annular sector 40b is defined to be the angular distance between a line passing through the center of the annular sector 40b and a line passing through the point at which a least squares evaluation occurs.

Deviation Surface 86

Once the fitted reference surface 84 is selected, a suitable deviation surface 86 is then identified from which deviation of the wafer surface may be calculated. Options include either a coincident deviation surface 386C (being coincident with the fitted reference surface 84) or a displaced deviation surface 386D (being displaced from the fitted reference surface 84), both shown in FIGS. 18 and 19.

In the presently illustrated but not necessarily preferred embodiment, when an annulus 44 is selected to be an EG evaluation area 7 (irrespective of whether a planar fitted surface 184 or a conical fitted surface 284 has been selected as fitted reference surface 84), the deviation surface 86 is defined to be a coincident deviation surface 386C. However, when an annular sector 40b is selected to be an ES evaluation area 9, a suitable deviation surface 86 may be either a coincident deviation surface 386C or a displaced deviation surface 386D.

A coincident deviation surface 386C may be defined to be either a coincident planar deviation surface 186C or a coincident conical deviation surface 286C, depending on the selected number of dimensions of the fitted reference surface 84. When a coincident deviation surface 386C is defined with a planar fitted surface 184, a coincident planar deviation surface 186C, such as shown in FIG. 18, is defined. When a coincident deviation surface 386D is defined with a conical fitted surface 284, a coincident conical deviation surface 286D, such as shown in FIG. 19, is defined.

When a displaced deviation surface 386D is defined with a planar fitted surface 184, a displaced planar deviation surface 186D, such as shown in FIG. 18, is defined, analogously to those defined in SEMI STD M1-1103 and SEMI MF1530-02, as that plane parallel to the planar fitted surface 184 but having zero deviation from the wafer surface 10 at the center point P of the annular sector 40b.

When a displaced deviation surface 386D is defined with a conical fitted surface 284, a displaced conical deviation surface 286D, such as is shown in FIG. 19, is defined to be that conical surface having the same a and b coefficients as the conical fitted surface 284, but displaced from the conical fitted surface 284 so that it has zero deviation from the wafer surface 10 at the center point P' of the annular sector 40b.

Metrics Calculation Format 88

Figure 20:
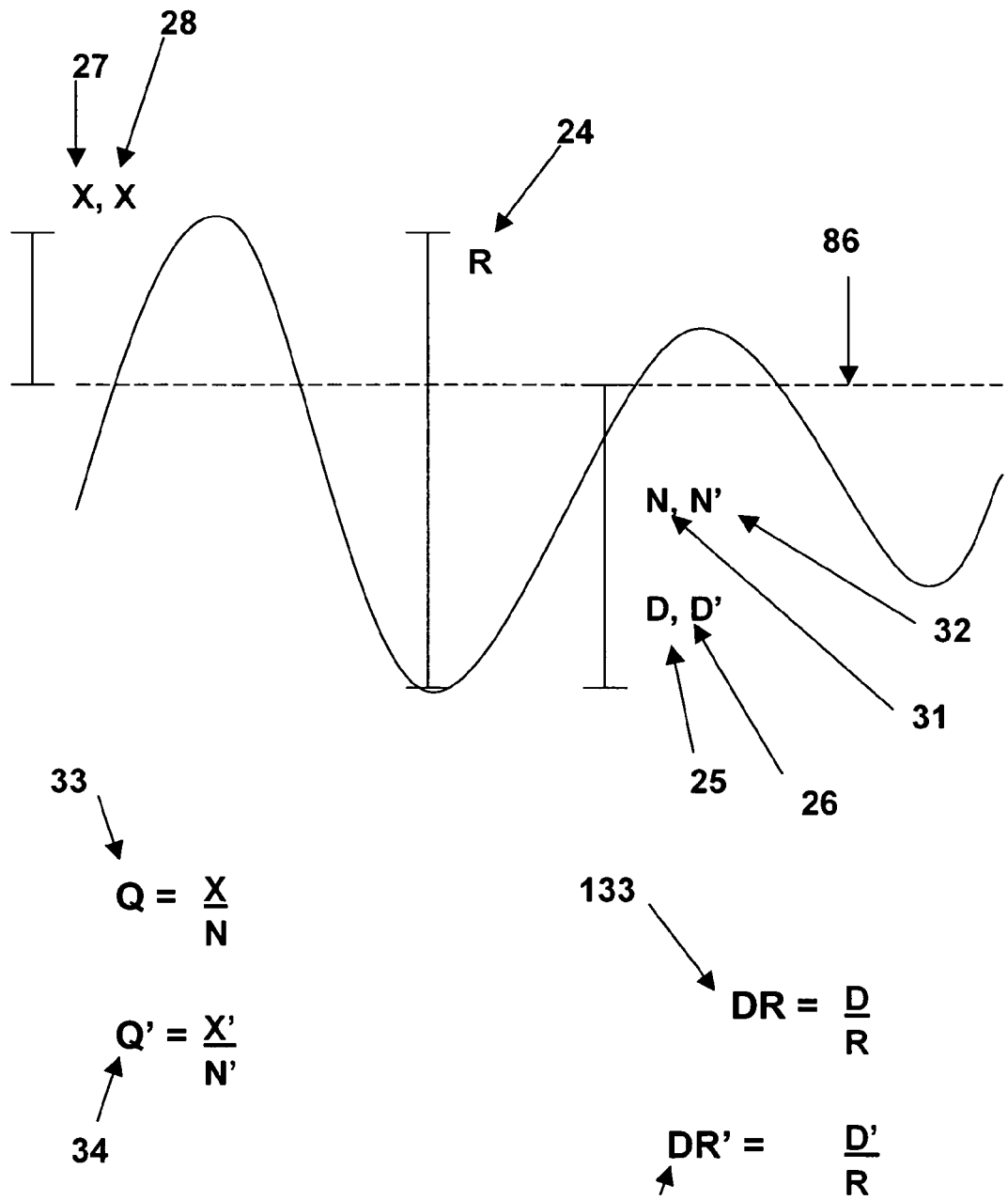
FIG. 20 is a side view of a wafer showing the edge-specific evaluation metrics 50 of the present invention.

Finally, the edge-specific metrics calculation format 88 options with which to show deviation, shown in an explanatory view in FIG. 20, are as follows:

The range of deviation, shown as "R", within the evaluation area 82, is known as the R metric 24.

The point deviation having the largest absolute value in a set of point deviations, each point deviation comprising an amount of deviation from a point on the evaluation area 82 to its corresponding point on the deviation surface 86. The point deviation having the largest absolute value, shown as "D, D'", is known as the D metric 25 for a displaced deviation surface 386D. It is known as D' metric 26 for a coincident deviation surface 386C.

The point deviation having the largest positive value in a set of point deviations, each point deviation comprising an amount of deviation from a point on the evaluation area 82 to its corresponding point on the deviation surface 86. The point deviation having the largest positive value, shown as "X, X'", is known as the X metric 27 for a displaced deviation surface 386D. It is known as the X' metric 28 for a coincident deviation surface 386C.

The point deviation having the largest negative value in a set of point deviations, each point deviation comprising an amount of deviation from a point on the evaluation area 82 to its corresponding point on the deviation surface 86. The point deviation having the largest negative value, shown as "N, N'", is known is known as the N metric 31 for a displaced deviation surface 386D. It is known as the N' metric 32 for a coincident deviation surface 386C.

The ratio of positive to negative point deviation within the evaluation area is known as the Q metric 33 for a displaced deviation surface 386D. It is known as the Q' metric 34 for a coincident deviation surface 386C.

The D metric 25 may be defined to provide either a signed or an unsigned value. A signed value is preferred, as additional information is thus provided about the surface of the wafer 10 at the evaluation area 82.

The N metric 31 and the N' metric 32 may be defined to provide either negative or positive values. When the N metric 31 is defined to be a positive value, it would correspond directly with values provided by the R metric 24 and X metric 27. Similarly, when the N' metric 32 is defined to be a positive value, it would correspond directly with values provided by the R metric 24 and X' metric 28. Metrics so developed could then be plotted on the same scale. Further, values provided by the R metric 24 would then equal the sum of the values provided by the N metric 31 and X metric 27; and values provided by the R metric 24 would then equal the sum of the values provided by the N' metric 32 and X' metric 28.

Also, defining the values provided by the N metric 31 and N' metric 32 as positive values allows them to have a direct numerical correspondence with Roll-off Amount (ROA); larger values of ROA thus correspond to larger values provided by the N metric 31 and N' metric 32. If positive values of the N metric 31 and N' metric 32 are desired, they are obtained by multiplying the value by −1.

The Q metric 33 is provided by dividing the value provided by the N metric 31 by the value provided by the X metric 27. Similarly, the Q' metric 34 is provided by dividing the value provided by the N' metric 32 by the value provided by the X' metric 28. Since the values provided by the X metric 27 and the X' metric 28 are always positive, when the values provided by the N metric 31 and N' metric 32 are defined to be positive, the values provided by the Q metric 33 and the Q' metric 34 are also positive; otherwise, they are negative.

While the Q metric 33 and the Q' metric 34 are described above in connection with the merely illustrative yet not necessarily preferred embodiment, it should be noted that it would be obvious for a person skilled in the art to combine metrics in different ways in order to create metrics for generating values quantifying other parameters for an evaluation area.

For example, another quotient metric quantifying a ratio of a first metric to a second metric could comprise a ratio of a deviation metric, for quantifying a point deviation having a largest absolute value, to a range metric, for quantifying a range of the amount of deviation in a set of point deviations of deviation within an evaluation area. Such a ratio could be known as the DR metric 133 for a displaced deviation surface 386D. It could be known as the DR' metric 134 for a coincident deviation surface 386C.

As another example, a summing metric quantifying a sum of a first metric to a second metric could comprise a sum of the deviation metric and the range metric. Such a ratio could be known as the S metric 233 for a displaced deviation surface 386D. It could be known as the S' metric 234 for a coincident deviation surface 386C.

The options for definition of the evaluation area 82, the fitted reference surface 84, and the deviation surface 86, and metrics calculation format 88 may be combined to generate edge-specific evaluation conditions 151. Certain edge-specific evaluation conditions 151 that are created by combinations of options are analogous to conditions useful in conventional wafer evaluation, and their uses are analogous also. For example, the ESFQD condition 55 and its uses are analogous to conventional SFQD conditions and its uses.

In addition, certain conditions created by combinations of options may be useful for analyzing specific edge-specific wafer characteristics. For example, the ESFQD metric 54 may prove helpful in analyzing Roll-Off Amount. Finally, certain edge-flatness evaluation conditions created by combinations of options do not provide logically reasonable or useful results. For example, no EGFQ conditions are defined because the EG evaluation area 7 is defined to be global while the FQ fitted reference surface 84FQ would be defined with an annular sector. Also, there are no EGBI' or ESBI' conditions because the BI fitted reference surface 84BI requires an ideal wafer back surface, which cannot have a conical component.

Edge-Specific Metrics 50

Edge-specific evaluation conditions 151 can be applied to a wafer evaluation system to provide edge-specific metrics 50. From edge-specific metrics 50 may then be derived edge-specific statistics 950, which comprise, for example, an average of all the values of the metric with which it is associated, for all of the evaluation areas 84 in a specified set. For example, for annular sector-defined ES evaluation areas 9, the set of evaluation areas 84 comprises all of the annular sectors in annulus 44. For annuli-defined EG evaluation areas 7, the set of evaluation areas 84 comprises all of the annuli defined on the wafer 10.

EG Conditions 110

Referring to FIGS. 15a-15c, EG conditions 110, which specify an edge global evaluation area 82EG (i.e., an annulus 44), include the EGBI conditions 410, the EGF3 conditions 420, and the EGFL conditions 440.

EGBI Conditions 410:

Referring to FIG. 15a, the EGBI conditions 322, which specify measuring the flatness of an Edge Global evaluation area 7 using an ideal wafer back surface planar fitted surface 184BI, which is used to define a BI coincident deviation surface 186BIC, provide the EGBIR metric 302, and its associated Mean EGBIR statistic 312.

EGF3 Conditions 420:

As shown in FIG. 15b, the EGF3 conditions 420, which specify measuring the flatness of an Edge Global evaluation area 7 using a planar F3 Three Point Front Surface fitted reference surface 184F3 and a coincident deviation surface 386C to define a Three Point Front Surface planar coincident deviation surface 186F3C, provide the following metrics and statistics:

- EGF3R metric 421 and its associated Mean EGF3R statistic 521.
- EGF3D' metric 426 and its associated Mean EGF3D' statistic 526,
- EGF3X' metric 427 and its associated Mean EGF3X' statistic 527,
- EGF3N' metric 428 and its associated Mean EGF3N' statistic 528, and
- EGF3Q' metric 429 and its associated Mean EGF3Q' statistic 529.

EGFL Conditions 440:

As shown in FIG. 15c, the EGFL conditions 440, which specify measuring the flatness of an Edge Global evaluation area 7 using a planar FL Least Squares Global Front Surface fitted reference surface 184FL and a coincident deviation surface 386C to define a Least Squares Global Front Surface planar coincident deviation surface 186FLC, provide the following metrics and statistics:

- EGFLR metric 441 and its associated Mean EGFLR statistic 541,
- EGFLD' metric 446 and its associated Mean EGFLD' statistic 546,
- EGFLX' metric 447 and its associated Mean EGFLX' statistic 547,
- EGFLN' metric 448 and its associated Mean EGFLN' statistic 548, and
- EGFLQ' metric 449 and its associated Mean EGFLQ' statistic 549.

ES Conditions 130

Referring to FIGS. 15d-15g, ES conditions 130, which specify an edge sector evaluation area 9 (i.e. annular sector 40b), include the ESBI conditions 310, the ESF3 conditions 320, the ESFL conditions 340, and ESFQ conditions 360.

ESBI Conditions 310:

As shown in FIG. 15d, the ESBI conditions 310, which specify measuring the flatness of an Edge Sector evaluation area 9 using a Planar Back Surface (Ideal) planar fitted surface 184BI, which is used to define a BI coincident deviation surface 186BIC and a BI displaced deviation surface 186BID, collectively known as BI planar deviation surfaces 186BI, provide the following metrics and statistics:

For BI planar deviation surfaces 186BI:
- ESBIR metric 311 and its associated Mean ESBIR statistic 911, For a BI planar displaced deviation surface 186BID:
- ESBID metric 312 and its associated Mean ESBID statistic 912,
- ESBIX metric 313 and its associated Mean ESBIX statistic 913,
- ESBIN metric 314 and its associated Mean ESBIN statistic 914,
- ESBIQ metric 315 and its associated Mean ESBIQ statistic 915, For a BI coincident deviation surface 186BIC:
- ESBID' metric 316 and its associated Mean ESBID' statistic 916,
- ESBIX' metric 317 and its associated Mean ESBIX' statistic 917,
- ESBIN' metric 318 and its associated Mean ESBIN' statistic 918, and
- ESBIQ' metric 319 and its associated Mean ESBIQ' statistic 919.

ESF3 Conditions 320:

As shown in FIG. 15e, the ESF3 conditions 320, which specify measuring the flatness of an Edge Sector evaluation area 9 using a planar F3 Three Point Front Surface fitted reference surface 184F3 and a deviation surface 86 (comprising one of the coincident deviation surface 386C or displaced deviation surface 386D) to define the Three Point Front Surface planar deviation surfaces 186F3 (comprising an F3 planar coincident deviation surface 186F3C and an F3 planar displaced deviation surface 186F3D), provide the following metrics and statistics:

For F3 planar deviation surfaces 186F3:
- ESF3R metric 321 and its associated Mean ESF3R statistic 921, For an F3 planar displaced deviation surface 186F3D:
- ESF3D metric 322 and its associated Mean ESF3D statistic 922,
- ESF3X metric 323 and its associated Mean ESF3X statistic 923,
- ESF3N metric 324 and its associated Mean ESF3N statistic 924,
- ESF3Q metric 325 and its associated Mean ESF3Q statistic 925, For an F3 planar coincident deviation surface 186F3C:
- ESF3D' metric 326 and its associated Mean ESF3D' statistic 926,
- ESF3X' metric 327 and its associated Mean ESF3X' statistic 927,
- ESF3N' metric 328 and its associated Mean ESF3N' statistic 928, and
- ESF3Q' metric 329 and its associated Mean ESF3Q' statistic 929.

ESFL Conditions 340:

As shown in FIG. 15f, the ESFL conditions 340, which specify measuring the flatness of an Edge Sector evaluation area 9 using a planar FL Least Squares Global Front Surface fitted reference surface 184FL and a deviation surface 86 (comprising a coincident deviation surface 386C or displaced deviation surface 386D) to define the Least Squares Global Front Surface deviation surfaces 186FL (comprising an FL planar coincident deviation surface 186FLC and an FL planar displaced deviation surface 186FLD), provide the following metrics and statistics:

For FL planar deviation surfaces 186FL:
- ESFLR metric 341 and its associated Mean ESFLR statistic 525.

For an FL planar displaced deviation surface 186FLD:
- ESFLD metric 342 and its associated Mean ESFLD statistic 942,
- ESFLX metric 343 and its associated Mean ESFLX statistic 943,
- ESFLN metric 344 and its associated Mean ESFLN statistic 944,
- ESFLQ metric 345 and its associated Mean ESFLQ statistic 945, For an FL planar coincident deviation surface 186FLC):
- ESFLD' metric 346 and its associated Mean ESFLD' statistic 946,
- ESFLX' metric 347 and its associated Mean ESFLX' statistic 947,
- ESFLN' metric 348 and its associated Mean ESFLN' statistic 948, and
- ESFLQ' metric 349 and its associated Mean ESFLQ' statistic 949.

ESFQ Conditions 360:

As shown in FIG. 15g, the ESFQ conditions 360, which specify measuring the flatness of an Edge Sector evaluation area 9 using a Least Squares Sector Front Surface fitted reference surface 84FQ (comprising one of the FQ planar fitted surface 184FQ or FQ conical fitted surface 284FQ') and a deviation surface 86 (comprising a coincident deviation surface 386C or displaced deviation surface 386D) to define Least Squares Sector Front Surface planar deviation surfaces 186FQ (comprising an FQ planar coincident deviation surface 186FQC and an FQ planar displaced deviation surface 186FQD) and Least Squares Sector Front Surface conical deviation surfaces 286FQ' (comprising an FQ conical coincident deviation surface 286FQ'C and an FQ conical displaced deviation surface 286FQ'D), provide the following metrics and statistics:

For FQ planar deviation surfaces 186FQ:
  ESFQR metric 361 and its associated Mean ESFQR statistic 961.
For an FQ planar displaced deviation surface 186FQD):
  ESFQD metric 362 and its associated Mean ESFQD statistic 962,
  ESFQX metric 363 and its associated Mean ESFQX statistic 963,
  ESFQN metric 364 and its associated Mean ESFQN statistic 964,
  ESFQQ metric 365 and its associated Mean ESFQQ statistic 965,
For an FQ planar coincident deviation surface 186FQC:
  ESFQD' metric 366 and its associated Mean ESFQD' statistic 966,
  ESFQX' metric 367 and its associated Mean ESFQX' statistic 967,
  ESFQN' metric 368 and its associated Mean ESFQN' statistic 968,
  ESFQQ' metric 369 and its associated Mean ESFQQ' statistic 969.
For FQ conical deviation surfaces 286FQ':
  ESFQ'R metric 371 and its associated Mean ESFQ'R statistic 971.
For an FQ conical displaced deviation surface 286FQ'D:
  ESFQ'D metric 372 and its associated Mean ESFQ'D statistic 972,
  ESFQ'X metric 373 and its associated Mean ESFQ'X statistic 973,
  ESFQ'N metric 374 and its associated Mean ESFQ'N statistic 974,
  ESFQ'Q metric 375 and its associated Mean ESFQ'Q statistic 975,
For an FQ conical coincident deviation surface 286FQ'C:
  ESFQ'D' metric 376 and its associated Mean ESFQ'D' statistic 976,
  ESFQ'X' metric 377 and its associated Mean ESFQ'X' statistic 977,
  ESFQ'N' metric 378 and its associated Mean ESFQ'N' statistic 978, and
  ESFQ'Q' metric 379 and its associated Mean ESFQ'Q' statistic 979.

Operation

Figure 10:
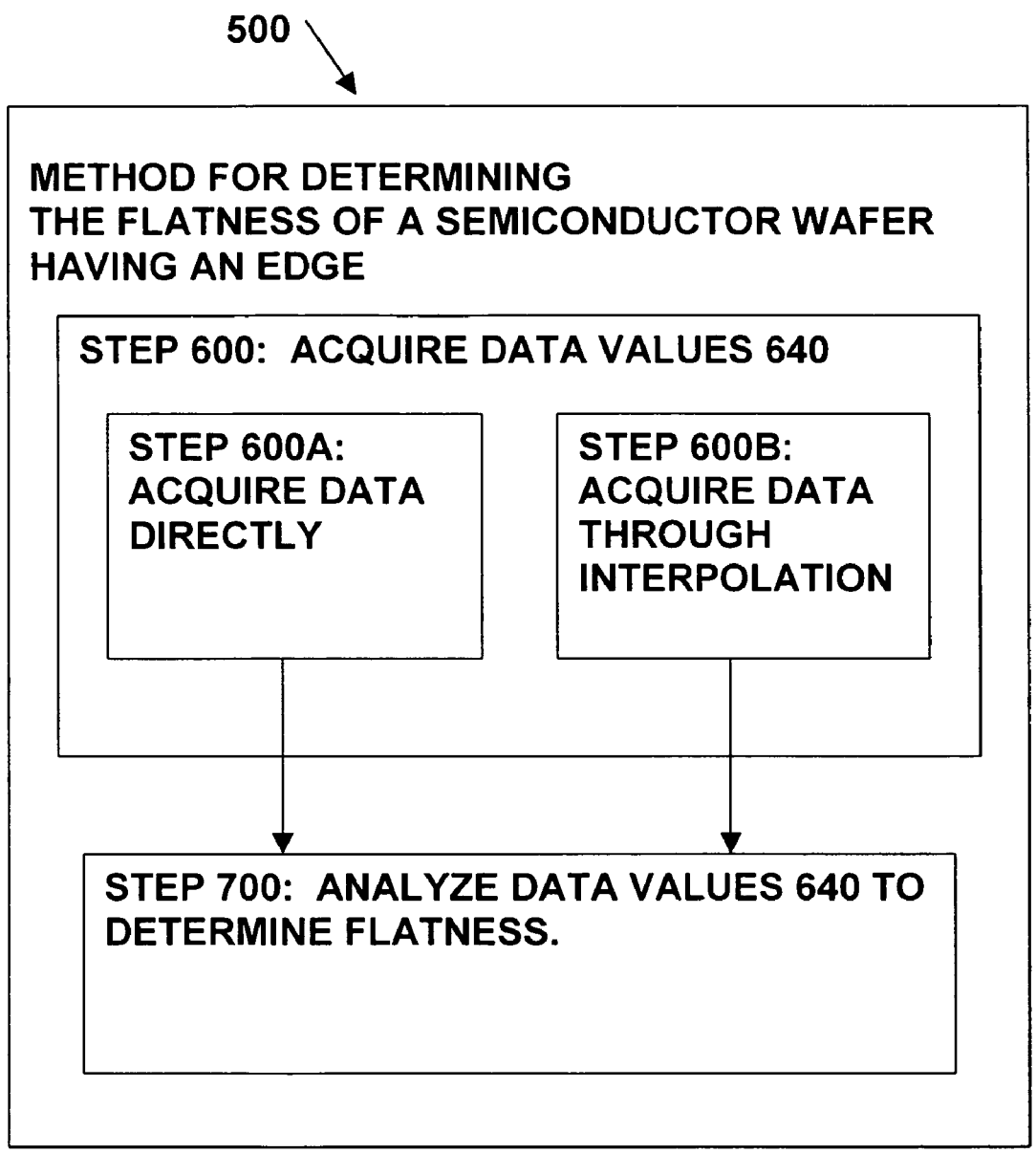
FIG. 10 is a flow chart of a method to evaluate flatness of a semiconductor wafer in accordance with the present invention.

In operation, as shown in FIGS. 9 and 10, the illustrative but not necessarily preferred embodiment has a wafer flatness evaluation system 200 using a method 500 for evaluating the flatness of a semiconductor wafer having an edge, in which a sample area is defined with reference to the sample's edge, and the flatness of the area is evaluated by evaluating the deviation between the area's surface and a deviation surface. As noted above, the flatness evaluation method of the illustrative but not necessarily preferred embodiment extends a flatness evaluation methodology described in U.S. Pat. No. 4,860,229 to take wafer boundary into account by developing evaluation areas that are defined with reference to the sample's edge and using edge-specific metrics 50 that are derived from edge-specific evaluation conditions 151.

The wafer flatness evaluation system 200 has a wafer data collection system 60 which generated data values 640 for selected locations on the surface of the wafer 10, and a wafer data analyzing system 70 for applying edge-specific evaluation conditions 151 to develop edge-specific metrics 50 and edge-specific statistics 950.

The method 500 has a step 600 for acquiring data values 640 for the wafer 10, and a step 700 for analyzing the data point values 640 to determine the flatness of a least a region of the wafer by determining the deviation of the wafer surface relative to a deviation surface.

Acquiring data for the locations on the annular sector in accordance with step 600 involves using an opposed pair of probes, not shown, to scan the front and back surface along a prescribed pattern, or by interferometric analysis such as that described in U.S. Ser. No. 10/411,019, entitled APPARATUS & METHOD FOR HOLDING & TRANSPORTING THIN OPAQUE PLATES and filed Apr. 9, 2003; and U.S. Ser. No. 10/308,484 entitled WEIGHTED LEAST SQUARE INTERFEROMETRIC MEASUREMENT OF MULTIPLE SURFACES and filed Dec. 3, 2002; and U.S. Ser. No. 10/393,883, entitled METHOD & APPARATUS FOR MEASURING SHAPE & THICKNESS VARIATION OF POLISHED OPAQUE PLATES, filed Mar. 20, 2003; all of which are herein incorporated by reference.

Alternatively, data may be acquired by obtaining the front surface height of a wafer 10 chucked on a surface. The data so obtained is constructed into a data array 644 that represents a surface of the wafer 10. For example, the data array 644 could be a front surface data array 641, a back surface data array 643, or a thickness data array 647 that represents the front surface as it would appear if the back surface is ideally flat.

Data for data array 644 may be collected from only the area being evaluated or, as in the illustrative but not necessarily preferred embodiment, from the entire sample, with those values selected for analysis from locations within the area being investigated. The locations within the sample area may be anywhere within the area at any suitable data point locations and may be defined using any appropriate coordinate system.

When, as in the illustrative but not necessarily preferred embodiment, the evaluation area is an annulus or an annular sector defined in a first coordinate system, such as the polar coordinate system, data point locations may be defined in the same coordinate system or in a second coordinate system such as the Cartesian coordinate system. Further, data values for locations that are defined by one coordinate system may be interpolated from data values from data point locations that are defined by another coordinate system.

Therefore, acquiring data for locations defined by polar coordinates in accordance with step 600 may be accomplished in a step 600a directly or in a step 600b through interpolation. Data values 640 may be direct data values 642 that are obtained by data development system 60 in a step 600a directly at locations defined by a selected coordinate system. Alternatively, data values 640 may be interpolated data values 645 that are developed in a step 600b for wafer locations defined by polar coordinates from data values obtained from wafer locations defined by Cartesian coordinates.

Figure 11:
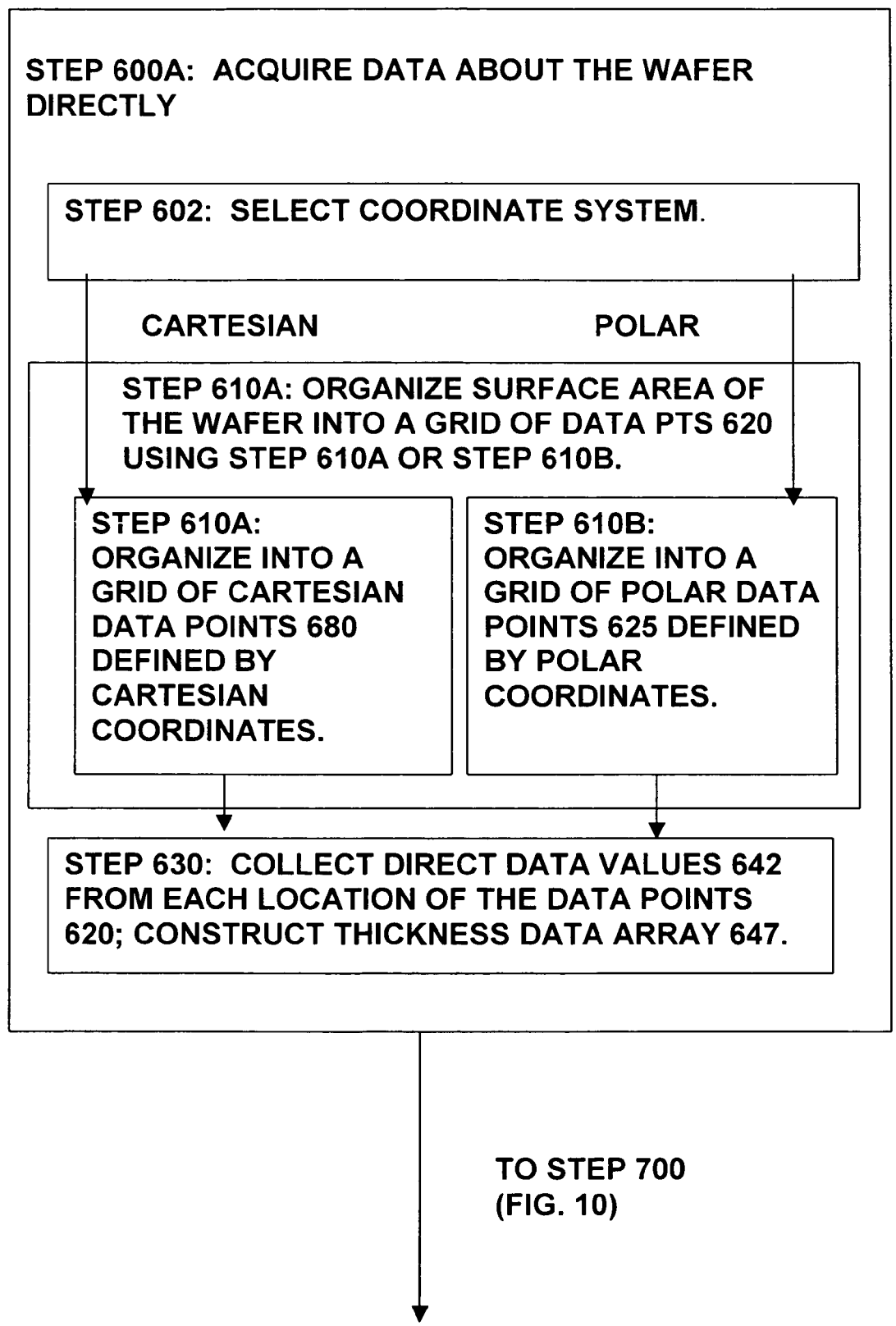
FIG. 11 is a flow chart of one method for acquiring wafer data for locations defined by polar coordinates.

FIG. 11 shows the step 600a when data values 640 are obtained from the wafer surface at the same locations on the wafers where the thickness measurement was made. In a step 610, the surface area of the wafer 10 is organized into a grid of data points 620. Data points 620 may be data points defined by any selected coordinate system. For example, data points 620 may be data points 625 that are defined by a polar coordinate system. Alternatively, data points 620 may be data points 680 that are defined by Cartesian coordinates.

If the Cartesian coordinate system is selected, for example, data points 680 may be located every 0.5 mm horizontally and vertically. In a step 610A, the wafer evaluating system 62 uses any suitable conventional Cartesian grid defining technique to construct the Cartesian grid. One such suitable rectangular grid construction technique is to use the MESHGRID function in the MATLAB™ technical computing system to generate X and Y matrices for three-dimensional plots. The MATLAB™ technical computing system is available from the MathWorks, Inc. of Natick, Mass.

If the polar coordinate system is selected, data points 625 may be located every 0.1 degrees in the angular direction and 0.2 mm in the radial direction. In a step 610b, the system 62 would use any suitable conventional polar grid defining technique to construct the polar grid. One such suitable polar grid defining technique is to use the POLAR function in the MATLAB™ technical computing system, to generate r and θ matrices.

After the locations of data points 620 are defined, in a step 630, direct data values 642 are collected from each of the locations of the data points 620, and the thickness data array 647 is constructed. The system 62 uses any suitable conventional wafer reading system to obtain the thickness data array 647.

FIG. 12 shows the step 600b when interpolated data values 645 are selected to be the data values 640. The wafer flatness evaluating system 200' shown in FIG. 13 may be used to operate the embodiment of step 600b shown in FIG. 12. The system 200' has a wafer data collection system 60' and a wafer data development system 62. Wafer data development system 62 has a location identification system 63 with a coordinate definition system 61, a zone and annular sector definition system 161 and a data exclusion and interpolation system 66, that uses input from the wafer data collection system 60' to provide interpolated data values 645 to a wafer data analyzing system 70 to develop the desired metrics and statistics.

Figure 13:
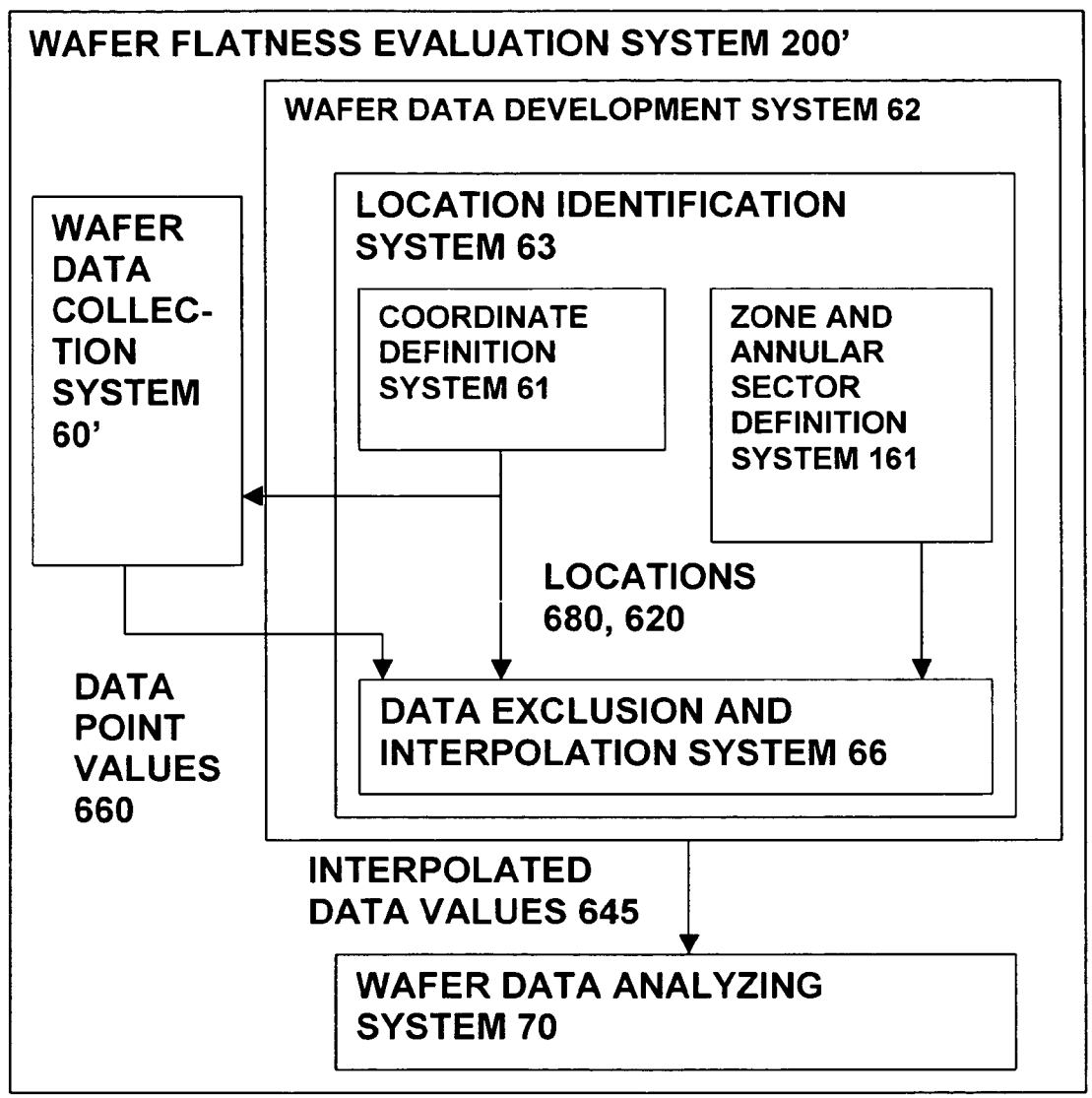
FIG. 13 is a block diagram of the wafer data collection system 60 for implementing the method of FIG. 12.

Referring to both FIG. 12 and FIG. 13, step 600b involves a coordinate definition step 650 for defining the data point locations 620, 680 for data analysis, and a step 670 for defining the zones 44, 64 and annular sectors 240a, 260a to be analyzed. It also involves a step 685 for obtaining from the wafer data collection system 60' the data values 660 for the selected locations in the selected zones and annular sectors. Finally, step 600b involves a step 690 for creating interpolated data values 645 for locations 620 that are defined by polar coordinates from data values 660 from locations 680 defined by Cartesian coordinates.

The coordinate definition step 650 involves a step 652, in which an input data Cartesian grid 651 is defined in order to form locations 680 that are defined by Cartesian coordinates. Locations 680 defined by Cartesian coordinates may be formed, for example, every 0.5 mm horizontally and vertically, for example in the same manner described above in connection with step 610A. In a step 653, polar coordinates corresponding to the locations 680 are calculated. Finally, in a step 654, locations 620 comprising a uniform grid of polar coordinates, are defined, for example, every 0.1 degrees in the angular direction and 0.2 mm in the radial direction, for example in the same manner described above in connection with step 610a.

Generally, the coordinate system and the locations of Cartesian coordinate-defined locations 680 are defined with step 650 as a part of the initial design of a wafer flatness evaluating system 200', and remain invariant. Once defined, the wafer flatness evaluating system 62 uses locations 680 as the locations for gathering data for all of the wafers 10 of the specified wafer size.

The zone and annular sector definition step 670 involves a step 672 in which zones 44, 64 that are annuli based on FQA boundary 22, intermediate radius 42, and inner radius 43 are defined. In a step 673, annular sectors 240a, 260a that are based on zones 44, 64 and a selected angle a are defined. The zones' angle a is chosen as its annular extent so that there is always a sector centered on each cardinal point (e.g. 180 degrees).

As noted before, in the illustrative but not necessarily preferred embodiment, the circumferential edge exclusion AA is defined relative to the nominal edge 14, and may be a value anywhere between 0 and the radius of the wafer 10. Suggested values of circumferential edge exclusion AA are 2, 3, 4, & 5 mm. In one embodiment of the invention, FQA boundary 22 is defined 2 mm from the nominal edge 14, and annular sector 240a, 260a are one of 72 annular sectors, respectively, in zones 44, 64, each having angular extent of 5° along zones 44, 64. Further, the radial extent ($L_R$) of zones 44, 64 is selectable; suggested values are $L_R$=10, 15, 20 or 26 mm.

Generally, the zone and annular sector definition step 670 is performed by the user as part of the set up of the wafer flatness evaluating system 200' for analysis of a selected set of wafers 10.

When the zones 44, 64 and annular sectors 240a, 260a are defined, the step 600b proceeds to a step 685 of obtaining a set of values 660 for locations 680 to prepare them for analysis. The data values 660 may be a set of values from a wafer 10 that is freshly determined by the wafer data collection system 60', or it could be a set of historical data that had been stored for future reference. The step 600b then proceeds to an exclusion and interpolation step 690 for developing a set of interpolated data values 645 for locations 620.

Step 690 starts with a step 692, in which the data exclusion and interpolation system 66 excludes from consideration any sectors in the wafer with features, such as notch and laser marks, that would disrupt flatness analysis. Then, in a step 694, the data exclusion and interpolation system 66 interpolates data values 660 that are not so excluded onto the desired locations 620. It uses the locations 680 and their associated data values 660, and the locations 620 (which are defined in polar coordinates), to develop interpolated data values 645 at the locations 620. The data exclusion and interpolation system 66 uses any suitable conventional interpolation technique to conduct the interpolation. One such suitable technique is to perform cubic interpolation using the INTERP2 "cubic" command in the MATLAB™ technical computing system.

Returning to FIG. 9 and FIG. 10, the data values 640 (whether they be data values 642 obtained directly or interpolated data values 645 developed though interpolation) may then be input into a wafer data analyzing system 70 to analyze data in a step 700. For example, the data point values 640, constructed into thickness data array 647, may be used by wafer data analyzing system 70 to develop edge-specific metrics 50 and edge-specific statistics 950 that are useful in evaluating wafer flatness at the wafer's periphery.

Referring to FIG. 14 and FIG. 3, in a step 700, the wafer data analyzing system 70 determines the deviation of the wafer surface relative to a deviation surface 86. With the definition of a fitted reference surface 84 and a suitable deviation surface 86, the thickness data array 647 may be used to calculate surface flatness at the wafer's periphery.

Step 700 starts with a step 710 of defining the appropriate edge-specific evaluation conditions 151. Such conditions are discussed above and identified in FIGS. 15a-15g. The variables within the conditions include an evaluation area 82 (such as annular sector 40a of FIG. 4), a fitted reference surface 84, a deviation surface 86, and a metric calculation format 88.

As shown in FIG. 22, the step 710 comprises a step 712 for selecting an evaluation area 82, a step 714 for defining a fitted reference surface 84, a step 716 for defining a deviation surface 86, and a step 718 for defining a metric calculation format 88.

As noted above, the evaluation area 82 defined in the step 712 may be either an "Edge Global" evaluation area or EG evaluation area 7 or, an "Edge Sector" evaluation area or ES evaluation area 9.

Step 714 defines the fitted reference surface 84 using the evaluation algorithm 384, outlined in FIGS. 23-25, which takes into account the desired number of dimensions of the fitted reference surface 84. Turning to FIG. 23, the step 714 starts with a step 715, in which the wafer surface for the fitted reference surface 84 is selected to be either the front surface 6, also known as "F", or the back surface 8, also known as "B". Once "F" or "B" is selected, step 714 proceeds to a step 713 to define a fitted reference surface 84, using either a step 713a to specify a planar fitted surface 184 or a step 713b to specify a conical fitted surface 284.

As shown in FIG. 24, in the step 713a, the coefficients a, b, c of a planar fitted surface 184 are selected using one of the planar fitted surface development methods described above, namely the Planar Back Surface (Ideal) method 384BI, the Planar Front Surface (Three Point) method 384F3, the Planar Front Surface Least Squares (Global) method 384FL, and the Planar Front Surface Least Squares (Sector) method 384FQ, to define one of planar surfaces 184, namely and respectively, a Planar Back Surface (Ideal) planar fitted surface 184BI, a Planar Front Surface (Three Point) planar fitted surface 184F3, a Planar Front Surface Least Squares (Global) planar fitted surface 184FL, and a Planar Front Surface Least Squares (Sector) planar fitted surface 184FQ.

As shown in FIG. 25, in the step 713b, the coefficients a, b, c of a conical fitted surface 284 are selected, using a Conical Front Surface Least Squares (Sector) method 484FQ', to define the Conical Front Surface Least Squares (Sector) conical fitted surface 284FQ'.

Returning to FIG. 22, when the step 714 is completed, the step 710 proceeds to the step 716 for defining the suitable deviation surface 86 from which deviation of the wafer surface may be calculated. As noted above, options include either a coincident deviation surface 386C (being coincident with the fitted reference surface 84) or a displaced deviation surface 386D (being displaced from the fitted reference surface 84). The step 710 then proceeds to its end to the step 718 for defining a metric calculation format 88 such as one described in detail above.

Referring to FIG. 4 with FIG. 14, when step 710 is completed, step 700 then proceeds to a step 730 for analyzing the data values 640a at the locations 620 within the annular sector 40a to determine the deviation of the surface of the annular sector 40a relative to a deviation surface 86. The data analyzing system 70 would select locations 620 located in the defined evaluation area 82, calculating edge-specific metrics 50 for the defined evaluation areas 82, such as the annular sectors 40a, in an annulus 44, using the desired set of edge-specific evaluation conditions 151.

The data analyzing system 70 would develop as many metrics as would be appropriate given the circumstances. For example, it would calculate the ESFQR metric 584 with valid data within each annular sector as defined above. In addition, it would calculate any other desired edge-specific metrics 50 and edge-specific statistics 950 such as those shown in FIGS. 15a-15g.

Returning to FIG. 14, step 700 would then proceed to a step 735, in which the data may be sorted to facilitate analysis. For example, thresholds 736 may be assigned to any metric 50 or statistic 950.

Step 700 would then proceed to a step 740, in which the data analyzing system 70 would present the results. Edge-specific metrics 50 and edge-specific statistics 950 are displayed, using display procedures such as the Site Metrics™ display that is available on the WaferSight™ system, which is available from Phase Shift Technology, Inc. (a wholly owned subsidiary of ADE Corporation, dba ADE Phase Shift), of Tucson, Ariz. For example, the edge-specific metrics 50 and edge-specific statistics 950 may be reported in spreadsheets, with metrics presented using rows for each sector and columns for each input parameter, and with statistics presented using rows for each set of metrics from which the statistic is developed and columns for each statistic type.

In addition, the annular sectors and zones associated with the calculated metrics and statistics to which thresholds have been applied could be displayed by presenting a figure of the wafer 10, showing the areas evaluated and using color to represent sorting data. For example, when thresholds are assigned to calculated metrics and statistics for sorting purposes, each annular sector or zone could be displayed in selected colors to show its passed or failed status. In addition, plots of metrics could be displayed, for example ESFQR plotted against theta values and variation around the wafer.

It will be appreciated that the present invention can be advantageously employed for characterizing wafers other than determining flatness. It will further be appreciated that the present invention can be advantageously employed for characterizing objects other than wafers. In addition, it is important to note that, while the present invention has been described in the context of a fully functioning data processing system, those of ordinary skill in the art will appreciate that the processes and methods of the present invention are capable of being distributed in the form of a computer readable medium of instructions and a variety of forms, and that the present invention applies equally regardless of the particular type of signal bearing media actually used to carry out the distribution. Examples of computer readable media include recordable-type media such as floppy discs, hard disk drives, RAM, CD-ROMs, and transmission-type media, such as digital and analog communications links.

The description of the present invention has been presented for purposes of illustration and description but is not intended to be exhaustive or limited to the invention in the form disclosed. Many modifications and variations will be apparent to those of ordinary skill in the art. This embodiment was chosen and described in order to best explain the principles of the invention, the practical application, and to enable others of ordinary skill in the art to understand the invention for various embodiments with various modifications as are suited to the particular use contemplated. Modifications of the presently disclosed invention are possible without departing from the scope of the appended claims.

The invention claimed is:

1. A system for evaluating characteristics of a surface of a sample having an edge, comprising:
   a data collection system for generating data values for selected locations on said surface;
   a data analyzing system for analyzing data in an evaluation area for said sample, said evaluation area being defined relative to said edge, and for applying edge-specific evaluation conditions to use edge-specific metrics to evaluate said evaluation area;
   wherein one of said edge-specific metrics comprises a minimum metric for quantifying a point deviation having a largest negative value in a set of point deviations, each of said point deviations comprising an amount of deviation from a point on said evaluation area to its corresponding point on said deviation surface.

2. The system of claim 1, wherein said data analyzing system further comprises a flatness evaluation system for evaluating flatness of said evaluation area by evaluating deviation between a point on said surface at said evaluation area and a corresponding point on said deviation surface.

3. The system of claim 1, wherein each of said metrics comprises a value for quantifying a parameter for said evaluation area.

4. The system of claim 1, wherein one of said edge-specific metrics comprises a range metric for quantifying a range of deviation within said evaluation area.

5. The system of claim 1, wherein one of said edge-specific metrics comprises a deviation metric for quantifying a point deviation having a largest absolute value in a set of point deviations, each of said point deviations comprising an amount of deviation from a point on said evaluation area to its corresponding point on said deviation surface.

6. The system of claim 1, wherein one of said edge-specific metrics comprises a maximum metric for quantifying a point deviation having a largest positive value in a set of point deviations, each of said point deviations comprising an amount of deviation from a point on said evaluation area to its corresponding point on said deviation surface.

7. The system of claim 1, wherein one of said edge-specific metrics comprises a quotient metric for quantifying a ratio of a first metric to a second metric.

8. The system of claim 1, wherein said data analyzing system further comprises using edge-specific statistics comprising values that are derived from said edge-specific metrics.

9. The system of claim 8, wherein said edge-specific statistics further comprise values that characterize a set of said evaluation areas.

10. The system of claim 8, wherein one of said edge-specific statistics comprises an arithmetic average of a metric quantifying a parameter for a set of evaluation areas.

11. The system of claim 7, wherein said quotient metric comprises a metric for quantifying a ratio of positive to negative point deviation within said evaluation area from said deviation surface.

12. The system of claim 7, wherein said quotient metric comprises a deviation to range metric for quantifying a ratio of a deviation to a range of deviations,
   wherein said first metric comprises a deviation metric, for quantifying said deviation comprising a point deviation having a largest absolute value deviation in a set of point deviations, each of said point deviations comprising an amount of deviation from a point on said evaluation area to its corresponding point on said deviation surface, and
   wherein said second metric comprises a range metric, for quantifying said range of deviations comprising a range of said amount of deviation in said set of said point deviations.

13. The system of claim 1, wherein one of said edge-specific metrics comprises a combination metric for combining a first metric and a second metric.

14. The system of claim 13, wherein said combination metric comprises a summing metric for summing said first metric and said second metric.

15. The system of claim 14, wherein said summing metric comprises a deviation range summing metric for quantifying a deviation and a range of deviations,
   wherein said first metric comprises a deviation metric, for quantifying said deviation comprising a point deviation having a largest absolute value deviation in a set of point deviations, each of said point deviations comprising an amount of deviation from a point on said evaluation area to its corresponding point on said deviation surface, and
   wherein said second metric comprises a range metric, for quantifying said range of deviations comprising a range of said amount of deviation in said set of said point deviations.

16. The system of claim 1, wherein said data collection system comprises:
   a first data collection system to collect first data values at first data locations defined on said sample in a first coordinate system; and
   a data development system to develop interpolated data values at second data locations defined on said sample in a second coordinate system.

17. The system of claim 16, wherein said data development system comprises a location identification system for identifying said second data locations, said location identification system comprising:
   a coordinate definition system, for defining said second data locations,
   a zone and annular sector definition system for defining desired second data areas, and
   a data interpolation system to use said first data values to provide interpolated data values for said desired second data areas to said data analyzing system.

18. The system of claim 16, wherein said data interpolation system further comprises a data exclusion system to exclude from consideration data from sample areas with features that would disrupt data analysis.

19. A system for evaluating characteristics of a surface of a sample having an edge, comprising:
   a data collection system for generating data values for selected locations on said surface;
   a data analyzing system for analyzing data in an evaluation area for said sample, said evaluation area being defined relative to said edge, and for applying edge-specific evaluation conditions to use edge-specific metrics to evaluate said evaluation area;

wherein one of said edge-specific metrics comprises a quotient metric for quantifying a ratio of a first metric to a second metric.

20. The system of claim 19, wherein said data analyzing system further comprises a flatness evaluation system for evaluating flatness of said evaluation area by evaluating deviation between a point on said surface at said evaluation area and a corresponding point on said deviation surface.

21. The system of claim 19, wherein one of said edge-specific metrics comprises a combination metric for combining a first metric and a second metric.

22. The system of claim 21, wherein said combination metric comprises a summing metric for summing said first metric and said second metric.

23. The system of claim 22, wherein said summing metric comprises a deviation range summing metric for quantifying a deviation and a range of deviations,
   wherein said first metric comprises a deviation metric, for quantifying said deviation comprising a point deviation having a largest absolute value deviation in a set of point deviations, each of said point deviations comprising an amount of deviation from a point on said evaluation area to its corresponding point on said deviation surface, and
   wherein said second metric comprises a range metric, for quantifying said range of deviations comprising a range of said amount of deviation in said set of said point deviations.

24. The system of claim 19, wherein said data collection system comprises:
   a first data collection system to collect first data values at first data locations defined on said sample in a first coordinate system; and
   a data development system to develop interpolated data values at second data locations defined on said sample in a second coordinate system.

25. The system of claim 24, wherein said data development system comprises a location identification system for identifying said second data locations, said location identification system comprising:
   a coordinate definition system, for defining said second data locations,
   a zone and annular sector definition system for defining desired second data areas, and
   a data interpolation system to use said first data values to provide interpolated data values for said desired second data areas to said data analyzing system.

26. The system of claim 24, wherein said data interpolation system further comprises a data exclusion system to exclude from consideration data from sample areas with features that would disrupt data analysis.

27. A system for evaluating characteristics of a surface of a sample having an edge, comprising:
   a data collection system for generating data values for selected locations on said surface;
   a data analyzing system for analyzing data in an evaluation area for said sample, said evaluation area being defined relative to said edge, and for applying edge-specific evaluation conditions to use edge-specific metrics to evaluate said evaluation area;
   wherein one of said edge-specific metrics comprises a quotient metric for quantifying a ratio of a first metric to a second metric; and
   wherein said quotient metric comprises a metric for quantifying a ratio of positive to negative point deviation within said evaluation area from said deviation surface.

28. The system of claim 27, wherein said data analyzing system further comprises a flatness evaluation system for evaluating flatness of said evaluation area by evaluating deviation between a point on said surface at said evaluation area and a corresponding point on said deviation surface.

29. The system of claim 27, wherein one of said edge-specific metrics comprises a combination metric for combining a first metric and a second metric.

30. The system of claim 29, wherein said combination metric comprises a summing metric for summing said first metric and said second metric.

31. The system of claim 30, wherein said summing metric comprises a deviation range summing metric for quantifying a deviation and a range of deviations,
   wherein said first metric comprises a deviation metric, for quantifying said deviation comprising a point deviation having a largest absolute value deviation in a set of point deviations, each of said point deviations comprising an amount of deviation from a point on said evaluation area to its corresponding point on said deviation surface, and
   wherein said second metric comprises a range metric, for quantifying said range of deviations comprising a range of said amount of deviation in said set of said point deviations.

32. The system of claim 27, wherein said data collection system comprises:
   a first data collection system to collect first data values at first data locations defined on said sample in a first coordinate system; and
   a data development system to develop interpolated data values at second data locations defined on said sample in a second coordinate system.

33. The system of claim 32, wherein said data development system comprises a location identification system for identifying said second data locations, said location identification system comprising:
   a coordinate definition system, for defining said second data locations,
   a zone and annular sector definition system for defining desired second data areas, and
   a data interpolation system to use said first data values to provide interpolated data values for said desired second data areas to said data analyzing system.

34. The system of claim 32, wherein said data interpolation system further comprises a data exclusion system to exclude from consideration data from sample areas with features that would disrupt data analysis.

35. A system for evaluating characteristics of a surface of a sample having an edge, comprising:
   a data collection system for generating data values for selected locations on said surface;
   a data analyzing system for analyzing data in an evaluation area for said sample, said evaluation area being defined relative to said edge, and for applying edge-specific evaluation conditions to use edge-specific metrics to evaluate said evaluation area;
   wherein one of said edge-specific metrics comprises a quotient metric for quantifying a ratio of a first metric to a second metric;
   wherein said first metric comprises a deviation metric, for quantifying said deviation comprising a point deviation having a largest absolute value deviation in a set of point deviations, each of said point deviations comprising an amount of deviation from a point on said evaluation area to its corresponding point on said deviation surface, and wherein said second metric comprises a range metric, for quantifying said range of deviations comprising a range of said amount of deviation in said set of said point deviations.

36. The system of claim 35, wherein said data analyzing system further comprises a flatness evaluation system for evaluating flatness of said evaluation area by evaluating deviation between a point on said surface at said evaluation area and a corresponding point on said deviation surface.

37. The system of claim 35, wherein one of said edge-specific metrics comprises a combination metric for combining a first metric and a second metric.

38. The system of claim 37, wherein said combination metric comprises a summing metric for summing said first metric and said second metric.

39. The system of claim 38, wherein said summing metric comprises a deviation range summing metric for quantifying a deviation and a range of deviations, wherein said first metric comprises a deviation metric, for quantifying said deviation comprising a point deviation having a largest absolute value deviation in a set of point deviations, each of said point deviations comprising an amount of deviation from a point on said evaluation area to its corresponding point on said deviation surface, and wherein said second metric comprises a range metric, for quantifying said range of deviations comprising a range of said amount of deviation in said set of said point deviations.

40. The system of claim 35, wherein said data collection system comprises:

a first data collection system to collect first data values at first data locations defined on said sample in a first coordinate system; and a data development system to develop interpolated data values at second data locations defined on said sample in a second coordinate system.

41. The system of claim 40, wherein said data development system comprises a location identification system for identifying said second data locations, said location identification system comprising:

a coordinate definition system, for defining said second data locations, a zone and annular sector definition system for defining desired second data areas, and a data interpolation system to use said first data values to provide interpolated data values for said desired second data areas to said data analyzing system.

42. The system of claim 40, wherein said data interpolation system further comprises a data exclusion system to exclude from consideration data from sample areas with features that would disrupt data analysis.

43. A system for evaluating characteristics of a surface of a sample having an edge, comprising:

a data collection system for generating data values for selected locations on said surface, wherein said data collection system comprises:

a first data collection system to collect first data values at first data locations defined on said sample in a first coordinate system; and a data development system to develop interpolated data values at second data locations defined on said sample in a second coordinate system; and a data analyzing system for analyzing data in an evaluation area for said sample, said evaluation area being defined relative to said edge, and for applying edge-specific evaluation conditions to use edge-specific metrics to evaluate said evaluation area;

wherein said data development system comprises a location identification system for identifying said second data locations, said location identification system comprising:

a coordinate definition system, for defining said second data locations, a zone and annular sector definition system for defining desired second data areas, and a data interpolation system to use said first data values to provide interpolated data values for said desired second data areas to said data analyzing system.

44. The system of claim 43, wherein said data analyzing system further comprises a flatness evaluation system for evaluating flatness of said evaluation area by evaluating deviation between a point on said surface at said evaluation area and a corresponding point on said deviation surface.

45. The system of claim 43, wherein one of said edge-specific metrics comprises a combination metric for combining a first metric and a second metric.

46. The system of claim 45, wherein said combination metric comprises a summing metric for summing said first metric and said second metric.

47. The system of claim 46, wherein said summing metric comprises a deviation range summing metric for quantifying a deviation and a range of deviations, wherein said first metric comprises a deviation metric, for quantifying said deviation comprising a point deviation having a largest absolute value deviation in a set of point deviations, each of said point deviations comprising an amount of deviation from a point on said evaluation area to its corresponding point on said deviation surface, and wherein said second metric comprises a range metric, for quantifying said range of deviations comprising a range of said amount of deviation in said set of said point deviations.

48. The system of claim 43, wherein said data interpolation system further comprises a data exclusion system to exclude from consideration data from sample areas with features that would disrupt data analysis.

49. A system for evaluating characteristics of a surface of a sample having an edge, comprising:

a data collection system for generating data values for selected locations on said surface, wherein said data collection system comprises:

a first data collection system to collect first data values at first data locations defined on said sample in a first coordinate system; and a data development system to develop interpolated data values at second data locations defined on said sample in a second coordinate system, wherein said data interpolation system further comprises a data exclusion system to exclude from consideration data from sample areas with features that would disrupt data analysis; and a data analyzing system for analyzing data in an evaluation area for said sample, said evaluation area being defined relative to said edge, and for applying edge-specific evaluation conditions to use edge-specific metrics to evaluate said evaluation area.

50. The system of claim 49, wherein said data analyzing system further comprises a flatness evaluation system for evaluating flatness of said evaluation area by evaluating deviation between a point on said surface at said evaluation area and a corresponding point on said deviation surface.

51. The system of claim 50, wherein one of said edge-specific metrics comprises a combination metric for combining a first metric and a second metric.

52. The system of claim 51, wherein said combination metric comprises a summing metric for summing said first metric and said second metric.

53. The system of claim 52, wherein said summing metric comprises a deviation range summing metric for quantifying a deviation and a range of deviations, wherein said first metric comprises a deviation metric, for quantifying said deviation comprising a point deviation having a largest absolute value deviation in a set of point deviations, each of said point deviations comprising an amount of deviation from a point on said evaluation area to its corresponding point on said deviation surface, and wherein said second metric comprises a range metric, for quantifying said range of deviations comprising a range of said amount of deviation in said set of said point deviations.

54. The system of claim 49, wherein said data development system comprises a location identification system for identifying said second data locations, said location identification system comprising:

a coordinate definition system, for defining said second data locations, a zone and annular sector definition system for defining desired second data areas, and a data interpolation system to use said first data values to provide interpolated data values for said desired second data areas to said data analyzing system.

* * * * *